United States Patent
Lowrey

(10) Patent No.: US 8,351,250 B2
(45) Date of Patent: Jan. 8, 2013

(54) PROGRAMMABLE RESISTANCE MEMORY

(75) Inventor: Tyler Lowrey, Rochester Hills, MI (US)

(73) Assignee: Ovonyx, Inc., Sterling Heights, MI (US)

( * ) Notice: Subject to any disclaimer, the term of this patent is extended or adjusted under 35 U.S.C. 154(b) by 1077 days.

(21) Appl. No.: 12/229,997

(22) Filed: Aug. 28, 2008

(65) Prior Publication Data

US 2010/0054030 A1 Mar. 4, 2010

(51) Int. Cl.
*G11C 11/00* (2006.01)
(52) U.S. Cl. .............. 365/163; 365/148; 977/754
(58) Field of Classification Search .......... 365/46, 365/94, 100, 113, 129, 148, 163; 257/2–5, 257/9, 296, 310, E21.35, E31.047, E27.006; 438/29, 95, 96, 166, 135, 240, 785, 259, 438/365, 482, 486, 597; 977/754

See application file for complete search history.

(56) References Cited

U.S. PATENT DOCUMENTS

| | | | | |
|---|---|---|---|---|
| 3,594,736 A * | 7/1971 | Hoffman | .......... | 365/208 |
| 5,534,712 A * | 7/1996 | Ovshinsky et al. | .......... | 257/3 |
| 6,128,215 A * | 10/2000 | Lee | .......... | 365/154 |
| 6,353,551 B1* | 3/2002 | Lee | .......... | 365/154 |
| 6,759,267 B2* | 7/2004 | Chen | .......... | 438/95 |
| 7,589,367 B2* | 9/2009 | Oh et al. | .......... | 257/296 |
| 2004/0012008 A1* | 1/2004 | Chen | .......... | 257/2 |
| 2006/0215440 A1* | 9/2006 | Cho et al. | .......... | 365/148 |
| 2006/0226459 A1* | 10/2006 | Oh et al. | .......... | 257/296 |
| 2008/0106922 A1* | 5/2008 | Park et al. | .......... | 365/72 |
| 2009/0310402 A1* | 12/2009 | Parkinson | .......... | 365/163 |

* cited by examiner

*Primary Examiner* — Harry W Byrne
(74) *Attorney, Agent, or Firm* — Kevin L. Bray

(57) ABSTRACT

A memory includes a programmable resistance array and unipolar MOS peripheral circuitry. The peripheral circuitry includes address decoding circuitry. Because unipolar MOS circuitry is employed, the number of mask steps and, concomitantly, the cost of the programmable resistance memory may be minimized.

13 Claims, 20 Drawing Sheets

PROGRAMMABLE RESISTANCE MEMORY

CROSS-REFERENCE TO RELATED APPLICATIONS

1. Field of Invention

This invention relates to electronic memory devices.

2. Background of the Invention

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories. Among the technologies being investigated are programmable resistance technologies, such as phase change memory technologies. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In some chalcogenide materials, the resistivity varies by two or more orders of magnitude when the material passes from the amorphous (more resistive) phase to the crystalline (more conductive) phase, and vice versa. Further, the resistivity of the chalcogenide materials generally depend on the temperature with the amorphous state generally being more temperature dependent that the crystalline state.

A chalcogenide memory device may utilize the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. A chalcogenide memory device's range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C. for GST 225, for example) and then cool it off rapidly, i.e. quench. From the electrical standpoint, it is possible to reach the crystallization and melting temperatures by causing a current to flow through a crystalline resistive element that heats the chalcogenic material by the Joule effect.

Each memory state of a chalcogenide memory material corresponds to a distinct range of resistance values and each memory resistance value range signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance of the material. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in Science News, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may be deposited with a reactive sputtering process with gasses such as N2 or O2: forming a chalcogenide nitride, or oxide, for example and chalcogenide may be modified by an ion implantation or other process. Materials may also be deposited using chemical vapor deposition (CVD) processes, for example.

Significant research and development efforts have been expended in an attempt to bring programmable resistance memories to full-scale production. Those efforts, to a large extent, have focused on the development of phase change materials, memory cell structures and memory array circuitry. Although highly efficient and cost effective, process methods and device structures that reduce the cost of programmable resistance memories would be highly desirable.

SUMMARY OF THE INVENTION

A programmable resistance memory in accordance with the principles of the present invention includes unipolar MOS peripheral circuitry configured to access an array of programmable resistance memory cells. By "unipolar MOS circuitry", we mean circuitry that employs exclusively NMOS or PMOS transistors.

Unipolar MOS technologies (that is, NMOS and PMOS technologies) antedate the CMOS technology which has substantially supplanted the older unipolar MOS and bipolar technologies in commercial integrated circuit production. As is known in the art, circuits based on CMOS technology typically boast considerably lower static power consumption than circuits based on either PMOS or NMOS technology. Digital circuits based on CMOS technology also produce output swings that encompass the entire range of a circuit's supply voltage. The availability of complementary transistors in CMOS technology greatly simplifies circuit design, when compared to the design of circuits of similar function implemented in non-CMOS technology. Additionally, CMOS does not require boot strapped gates and can generally operate at lower supply voltages than other technologies. For these reasons, CMOS technology has become the technology of choice in digital logic and memory applications. However, the process of producing a given circuit in CMOS technology is substantially more complex than a comparable circuit implemented in unipolar MOS technologies.

Rather than focusing exclusively on programmable resistance memory cells and related technologies to reduce the cost of production, the applicant has devised a programmable resistance memory device and process architecture that greatly simplifies the production of the peripheral circuitry that supports a programmable resistance memory. In this way, a programmable resistance memory in accordance with the principles of the present invention may be produced at a substantially lower cost than conventional programmable resistance memories. In particular, as memory devices steadily increase in capacity, the peripheral circuitry that supports the memory array becomes more and more complex. In order to accommodate that complexity, additional process steps must be included to incorporate the additional layers of interconnect needed to define the increasingly complex support circuits. This is particularly true of CMOS circuitry because considerable additional processing is required to build 2 types of MOS transistors; N-ch and P-ch MOSFETS. By employing unipolar MOS peripheral circuitry in accordance with the principles of the present invention, a programmable resistance memory in accordance with the principles of the present invention may be produced using a much simpler production process than that required for a programmable resistance memory of comparable capacity employing CMOS peripheral circuitry. In an illustrative method in accordance with the principles of the present invention, a unipolar MOS programmable resistance memory may be produced with fewer than eleven mask steps, no more than five of which are critical mask steps. Recognizing that phase change memories do not require the full supply-voltage logic swings provided by CMOS technology, that the power dissipation of unipolar MOS circuits may be brought in line with CMOS technology by, for example, turning unipolar devices off whenever the memory is not being accessed, and that the higher design costs associated with unipolar MOS design may be amortized over a large number of unipolar MOS phase change memory devices that may be produced much more efficiently than CMOS phase change memory devices, a programmable resistance memory in accordance with the principles of the present invention employs unipolar MOS, rather than CMOS technology, for the memory's peripheral circuitry.

Additional cost reductions may be achieved in accordance with the principles of the present invention by reducing the extent of unipolar peripheral circuitry included on each standalone memory. Such a reduction in circuitry increases the number of standalone memory devices that may be produced from a given wafer and, at the same time, increases the yield of devices produced. As an added benefit, by offloading the functionality of a portion of the peripheral circuitry, a programmable resistance memory in accordance with the principles of the present invention reduces its power consumption.

In an illustrative system embodiment, the functionality of the offloaded peripheral circuitry is incorporated in a peripheral circuit device, such as a memory controller, that may be implemented in a lower-power technology, such as CMOS, for example. The offloaded functionality from a plurality of unipolar MOS programmable resistance memories in accordance with the principles of the present invention may be consolidated in such a peripheral circuit device. In this manner, a programmable resistance memory system in accordance with the principles of the present invention may reap the substantial cost benefits of low-complexity, low-maskstep programmable resistance memory devices while, at the same time, reducing die size and paying little or no power penalty in comparison with conventional programmable resistance memories that employ on-chip CMOS peripheral circuitry.

In accordance with the principles of the present invention, unipolar MOS drivers may be configured to access a memory cell within an array of memory cells. Such an access may involve reading from a memory cell or writing to a memory cell, for example. In an illustrative embodiment, unipolar devices are employed as both row and column drivers. In accordance with the principles of the present invention, drivers may also be used to supply access signals, that is, read or write current or voltage pulses, to an array of memory cells. Access signals may be provided to a memory from an external circuit, with unipolar drivers in accordance with the principles of the present invention configured to receive and gate the appropriate (that is, read, write 0, write 1, write 00, write 11, etc) signal to one or more selected memory cells.

In an illustrative, minimal-configuration embodiment, a programmable resistance memory in accordance with the principles of the present invention includes only a programmable resistance array, unipolar row and column drivers, unipolar address decoder circuitry, and unipolar I/O circuitry; all other peripheral circuitry is offloaded to one or more other integrated circuits. A programmable resistance memory in accordance with the principles of the present invention may employ epitaxial diodes as isolation devices within the devices' memory array. Epitaxial diodes provide superior operating characteristics and their production process permits the use of low-resistivity conductors, such as copper, for example, to interconnect a memory's various devices. Copper interconnection provides higher conductivity and is less susceptible to electro-migration failure than conventional, aluminum or tungsten, interconnection. In accordance with the principles of the present invention, the copper interconnection may be used to "strap," or "mirror," drive circuits within a memory's substrate, thereby drastically reducing the resistance within a memory's signal path and providing higher signal margins. In an illustrative embodiment an N+ region within a substrate is used as a local rowline to which epitaxial cathodes are connected. A strapping connection is made between the local N+ rowline and a copper interconnect line spaced every thirty-two memory elements. In another illustrative embodiment, the connection is made at least every sixteen memory elements. To reduce resistance in the rowline even further a strapping connection may be made every eight memory elements of a rowline.

A unipolar MOS programmable resistance memory in accordance with the principles of the present invention may be particularly suitable for operation in a variety of electronic devices, including cellular telephones, radio frequency identification devices (RFID), computers (portable and otherwise), solid state drives (SSDs), location devices (e.g., global positioning system (GPS) devices, particularly those that store and update location-specific information), and handheld electronic devices, including personal digital assistants (PDAs), and entertainment devices, such as MP3 players, for example.

DETAILED DESCRIPTION

Figure 1:
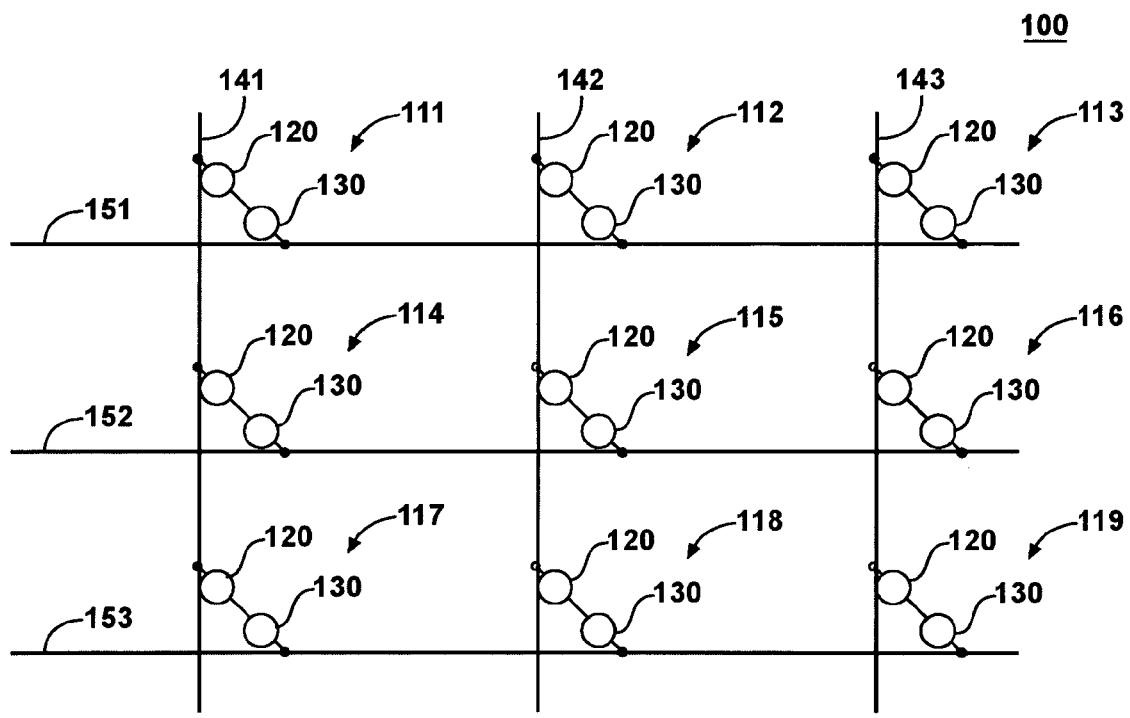
FIG. 1 is a block diagram of an array of memory cells, each including an isolation device and a programmable resistance memory element, in accordance with the principles of the present invention.

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. Process descriptions may include flowcharts that illustrate various steps taken in a process. Such flowcharts and accompanying discussion are not meant to be an exhaustive explanation of every step and every procedure in such a process. Rather, they are meant to provide a description with sufficient detail to enable one of ordinary skill in the art to practice and use the invention. In some embodiments, additional steps may be employed or steps may be carried out in a different sequence than set forth in the flowchart and associated discussion. Accordingly, the scope of the invention is defined only by reference to the appended claims.

In an illustrative embodiment, a memory in accordance with the principles the present invention couples unipolar MOS peripheral circuitry (e.g., n-type or p-type MOSFET also referred to herein as NMOS or PMOS circuitry) with programmable resistance memory to yield a standalone circuit that includes memory and peripheral circuitry. In an illustrative embodiment, the programmable resistance memory is a phase change memory and the unipolar peripheral circuitry is formed in an NMOS process. For clarity and convenience, reference will be made to NMOS transistors and circuitry, but PMOS transistors and circuitry are contemplated within the scope of the invention. In an illustrative embodiment, the NMOS and phase change memory formation processes are simpler processes that require relatively few mask steps. As a result, standalone memories in accordance with the principles of the present invention may be produced at a fraction of the cost of conventional designs.

Typically, in integrated circuit manufacturing, the formation of each layer typically requires several process steps. Such process steps may include: deposition, lithography, etching, cleaning, dielectric deposition, and planarization, for example. Conventional CMOS memories have had to rely upon dramatically increased numbers of mask steps (along with ancillary steps just described) in order to achieve greater memory densities. A conventional CMOS memory of 128 Mbit or more requires at least twenty-five to thirty mask steps. Each additional mask step adds significantly to the cost of production, limits production flexibility, decreases reliability, increases production cycletimes, and increases inventory costs.

A unipolar MOS programmable resistance memory in accordance with the principles of the present invention may be produced using fewer than half the number of mask steps required for a CMOS memory of comparable capacity. Further savings may be realized in the production of a standalone programmable resistance memory in accordance with the principles of the present invention through use of a limited number of critical mask steps. In illustrative embodiments, a standalone programmable resistance memory in accordance with the principles of the present invention having a capacity of at least 128 Mbit requires only nine or ten mask steps, only five of which are critical. A critical mask step is one that requires the latest generation of photolithographic stepper to execute. A non-critical mask step is one that may be executed using older photolithographic stepper equipment, such as steppers of the previous one or two generations. Such older equipment is much less expensive to own and operate than steppers of the latest generation.

Each memory cell may include both a memory element and an isolation device. The isolation device prevents inadvertent accesses of the memory element. The isolation device may be an epitaxial diode formed on a substrate, for example. Copper interconnect may be employed with a standalone memory in accordance with the principles of the present invention. Example thin film materials such as may be used in the formation of a memory element include chalcogenide materials (e.g. GeSbTe 225). Interconnect conductive materials include, for example, Al, Cu, and W. Electrode material may include, C, TiAlN, TiSiN, or TiN, for example. Insulator materials may be, $SiO_2$, $SiN_x$, or $Al_2O_3$, for example. AsGeInSiTe 35/7/0.25/18/40 may be used as an ovonic threshold switch (OTS) material, for example, in embodiments in which an OTS device is used as an isolation device.

For the purposes of this discussion, a "standalone circuit" refers to an integrated electronic circuit that is configured to accept at least one input from, and provide at least one output to, at least one other electronic device. Each standalone circuit typically includes input and output structures, such as pads for connection to external circuits and input and output drivers connected to those pads for communication with circuits external to the standalone circuit. Various packaging schemes may be employed with such a standalone circuit, including hybrid packaging, conventional bump bonding, chip-on-board, single-in-line packaging, dual-in-line packaging, for example. Whatever packaging scheme is employed, the standalone circuit includes input and output drivers connected to pads employed for interconnection with other electronic circuits.

In the illustrative embodiment of FIG. 1, a memory array 100 in accordance with the principles of the present invention includes memory cells 111-119 arranged in a cross-point array. Each cell includes a memory element 130 and an isolation device 120. For the convenience of illustration, only nine cells are shown. As will be described in greater detail in the discussion related to FIGS. 4 through 5O, the memory element 130 may be implemented as a programmable resistance element that employs phase change material, such as GeSbTe 225, for example. The isolation device 120 may be implemented as a diode or as an ovonic threshold switch (OTS), for example.

The memory array 100 includes column lines 141-143 and row lines 151-153, which are used to select a particular memory cell within the array during an access operation. An access operation may be a READ operation, or a WRITE operation, for example. In a binary memory configuration, each cell may be written to a "1" or a "0." In a multi-level configuration, each cell may be written to any of three or more memory states. Row lines 151-153 and column lines 141-143 may also be referred to herein, respectively, as word address and column address lines.

With memory elements 130 connected to word address lines and coupled through isolation devices 120 to bit address lines 141-143, a specific memory cell is accessed by assertion of the appropriate word and bit address lines. Asserting word address line 152 and bit address line 142, for example, selects memory cell 115 for access (that is, for a READ or WRITE operation).

In operation, the isolation device 120 may act as a switch that is either "off" or "on" depending on the voltage applied across the memory cell 111-119. The off state may be a substantially electrically nonconductive state and the on state may be a substantially conductive state. The isolation device 120 may exhibit a threshold voltage beyond which the device becomes highly conductive. With an applied potential less than the threshold voltage, the device is, effectively, an open circuit, thereby isolating the associated memory element 130. With an applied voltage greater than the threshold voltage, the device is, effectively, a short circuit, thereby allowing access to the associated memory element 130. With the isolation device 120 "thresholded," a portion of the voltage applied across the memory cell 111 will fall across the isolation device 120. The remainder of the applied voltage will fall across the memory element 130 and, when properly biased, that portion of the applied voltage will be sufficient to perform an access operation (e.g., READ or WRITE). The isolation device 120 may also be referred to as an access device, a select device, or a switch, for example.

Figure 2:
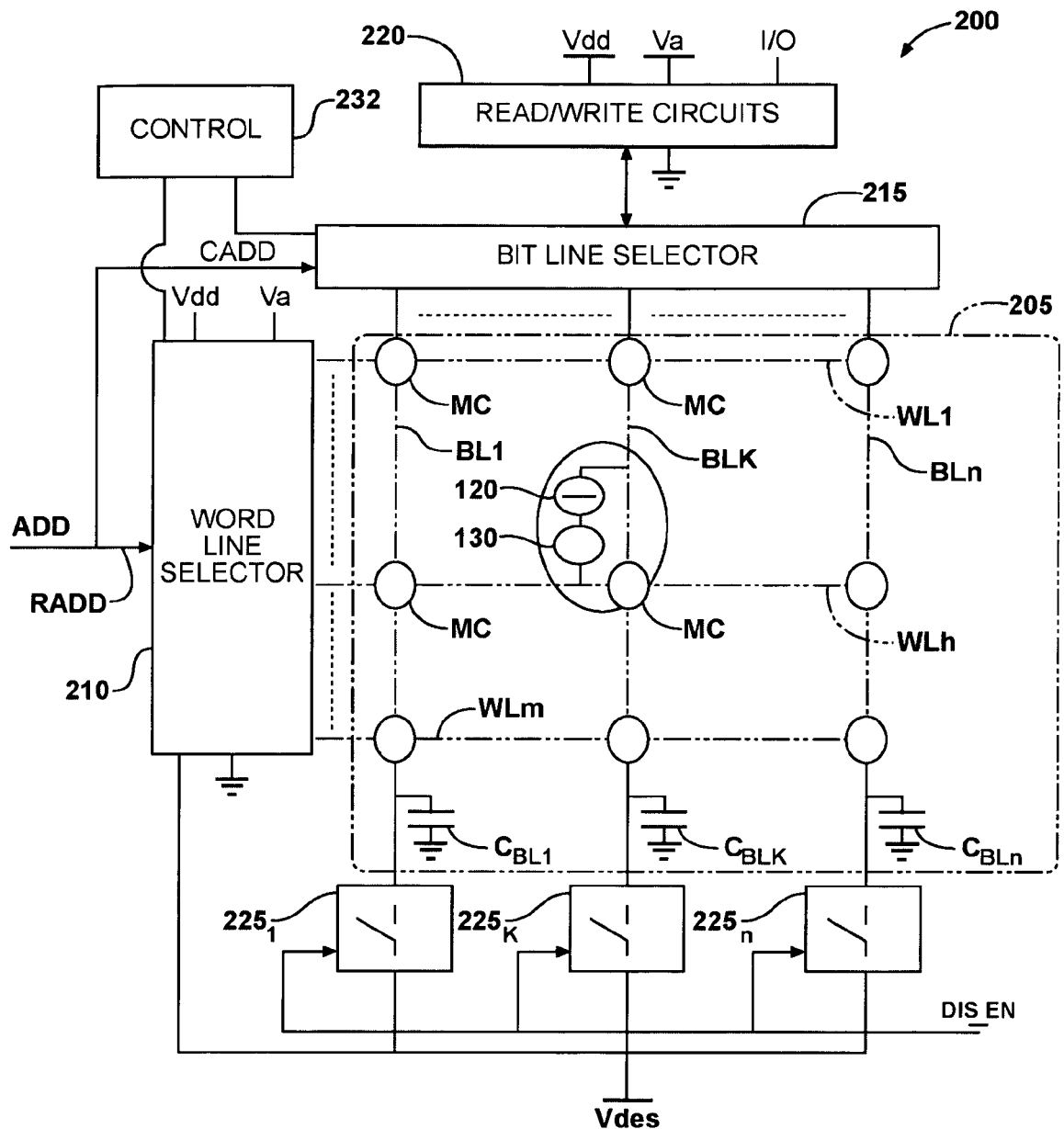
FIG. 2 is a block diagram of a memory array, including peripheral circuitry, in accordance with the principles of the present invention.

The block diagram of FIG. 2 illustrates a crosspoint array of memory cells such as those of FIG. 1, along with associated access circuitry. In this illustrative embodiment, the memory cells are labeled MC, the row/word lines are labeled WLn, and the column/bit lines are labeled Bln. As previously noted, the terms, "rows," "word lines," "bit lines," and "columns" are merely meant to be illustrative and are not limiting with respect to the type and style of the sensed array. The memory 200 includes a plurality of memory cells MC arranged in an array 205. The memory cells MC in the matrix 205 may be arranged in m rows and n columns with a word line WL1-WLm associated with each matrix row, and a bit line BL1-BLn associated with each matrix column.

The memory 200 may also include a number of auxiliary lines including a supply voltage line Vdd and a ground (also referred to as reference) voltage line, respectively distributing a supply voltage Vdd and ground voltage throughout the memory 200. Depending on configurations and materials, the supply voltage Vdd may be, for example, in a range from 1V to 3V: 1.8V, for example. A high voltage supply line Va may provide a relatively high voltage, generated by devices (e.g. charge-pump voltage boosters not shown in the drawing) integrated on the same chip (that is, included on the same standalone device), or externally supplied to the memory device 200. For example, the high voltage Va may be 4.5-5 V and such a voltage may be employed, for example to provide a relatively high current to a selected memory cell and to thereby melt phase change material contained within a memory element.

Each memory cell MC includes a memory element 130 that employs a programmable resistance memory material, such as phase change memory material, and an isolation device 120, as described in the discussion related to FIG. 1. Each memory cell MC in the matrix 205 is connected to a respective one of the word lines WL1-WLm and a respective one of the bit lines BL1-BLn. In particular, the storage element 130 may have a first terminal connected to the respective word line WL1-WLn and a second terminal connected to a first terminal of the associated access device 120. The access device 120 may have a second terminal connected to a bit line BL1-BLm. Alternatively, the storage element 130 may be connected to the respective bit line BL1-BLm and the access device 120, associated with the storage element 130, may be connected to the respective word line WL1-WLn.

A memory cell MC within the matrix 205 is accessed by selecting the corresponding row and column pair, i.e. by selecting the corresponding word line and bit line pair. Word line selector circuits 210 and bit line selector circuits 215 may perform the selection of the word lines and of the bit lines on the basis of a row address binary code RADD and a column address binary code CADD, respectively, of a memory address binary code ADD, for example received by the memory device 200 from a device external to the memory (e.g., a microprocessor). The word line selector circuits 210 may decode the row address code RADD and select a corresponding one of the word lines WL1-WLm, identified by the specific row address code RADD received. The bit line selector circuits 215 may decode the column address code CADD and select a corresponding bit line or, more generally, a corresponding bit line packet of the bit lines BL1-BLn. For example, the number of selected bit lines depending on the number of data words that can be read during a burst reading operation on the memory device 200. A bit line BL1-BLn may be identified by the received specific column address code CADD.

The bit line selector circuits 215 interface with read/write circuits 220. The read/write circuits 220 enable the writing of desired logic values into the selected memory cells MC, and reading of the logic values currently stored therein. For example, the read/write circuits 220 may include sense amplifiers together with comparators, reference current/voltage generators, and current pulse generators for reading the logic values stored in the memory cells MC. In an illustrative embodiment, a substantial portion of the read/write circuit 220 may be supplied to a standalone memory in accordance with the principles of the present invention from another device, such as a memory controller. By moving such functional blocks from the standalone memory, the cost of producing each memory could be further reduced.

In an illustrative embodiment, in a stand-by operating condition, as well as before any read or write access to the memory device 200, the word line selection circuits 210 may keep the word lines WL1-WLm at a relatively high de-selection voltage Vdes (e.g., a voltage roughly equal to half the high voltage Va (Va/2)). At the same time, the bit line selection circuits 215 may keep the bit lines BL1-BLn disconnected, and thus isolated, from the read/write circuits 220 or, alternatively, at the de-selection voltage Vdes. In this way, none of the memory cells MC is accessed, since the bit lines BL1-BLn are floating or a voltage close to the deselected word lines such that approximately zero voltage is dropped across the access elements 120. Additionally, spare (redundant) rows and columns may be provided and used with a selection means to replace bad rows, bits, and columns by techniques familiar to those skilled in the art. Access methods such as may be employed by a standalone memory in accordance with the principles of the present invention are disclosed, for example, in U.S. Pat. No. 7,280,390, to Kostylev et al, and U.S. Pat. No. 7,154,774 to Bedeschi et al, which are hereby incorporated by reference.

During an access operation, the word line selection circuits 210 may lower the voltage of the selected one of the word lines WL1-WLm to a word line selection voltage $V_{WL}$ (for example, having a value equal to 0V, the ground potential if a bipolar diode or chalcogenide cell, such as an ovonic threshold switch, isolation device is used), while the remaining word lines may be kept at the word line de-selection voltage Vdes in one embodiment. In an illustrative embodiment, the N+ strapping of a memory's source/drain region may be used to drive memory cells' isolation devices. In such a configuration the deselected state is a high voltage. Because the majority of the word lines are deselected, setting the deselect voltage somewhat below Va may be employed to reduce leakage current to the memory's substrate. Similarly, the bit line selection circuits 215 may couple a selected one of the bit lines BL1-BLn (more typically, a selected bit line packet) to the read/write circuits 220, while the remaining, non-selected bit lines may be left floating or held at the de-selection voltage, Vdes, which could be 0V for the case of the diode access device embodiment. Typically, when the memory device 200 is accessed, the read/write circuits 220 force a suitable current pulse into each selected bit line BL1-BLn. The pulse amplitude, duration, and wave-shape, including rate of descent, may depend, for example, on the operation to be performed.

In an illustrative embodiment, during a reading operation a read current pulse may be applied to each selected bit line. The read current pulse may be provided "on-chip" or may be supplied by circuitry "off-chip" connected to a low-complexity standalone memory in accordance with the principles of the present invention. The read pulse features the appropriate amplitude, shape, and duration characteristics for a read operation. The read current charges stray capacitances $C_{BL1}$-$C_{BLn}$ (1 pF, typically), intrinsically associated with the bit lines BL1-BLn and column drive circuitry and, as a result, imposes a transient bit line voltage $V_{BL}$ on each selected bit line BL1-BLn. When the read current is forced onto each selected bit line BL1-BLn, the respective bit line voltage raises towards a corresponding READ value, depending, at least in part, on the resistance of the storage element 130. The READ voltage/resistance corresponds to the logic value stored in the selected memory cell MC.

Methods for reading and writing programmable resistance memories are known and disclosed, for example, in: U.S. Pat. No. 7,154,774 to Bedeschi et al, published U.S. patent application 2006/0056251 to Parkinson, published U.S. patent application 2006/0227590 to Parkinson, published U.S. patent application 2006/0279979 to Lowrey et al, and published U.S. patent application 2006/0227592 to Parkinson et al, which are hereby incorporated by reference. In order to avoid spurious reading of the memory cells MC, the bit line stray capacitances $C_{BL1}$-$C_{BLn}$ may be discharged before performing a read operation. To that end, bit line discharge circuits $225_{1-n}$ may be enabled in a bit line discharge phase of the memory device operation that may take place before or after an access operation, for example. The bit line discharge circuits $225_{1-n}$ may employ N-channel MOSFETs, for example, each having a drain terminal connected to the corresponding bit line BL1-BLn, a source terminal connected to a de-selection voltage supply line Vdes providing the de-selection voltage Vdes and a gate terminal controlled by a discharge enable signal DIS_EN.

In an illustrative embodiment, before starting an access operation, the discharge enable signal DIS_EN may be temporarily asserted to a sufficiently high positive voltage, so that all the discharge MOSFETs turn on and connect the bit lines BL1-BLn to the de-selection voltage supply line Vdes. The discharge currents that flow through the discharge transistors cause the discharge of the bit line stray capacitances $C_{BL1}$-$C_{BLn}$ and thereby drive the bit lines to the de-selection voltage Vdes. Subsequently, before selecting the desired word line WL1-WLm, the discharge enable signal DIS_EN is de-asserted and the discharge MOSFETs turned off. Similarly, the selected row and column lines may be respectively precharged to an appropriate safe starting voltage for selection and read or write operation.

Figure 3:
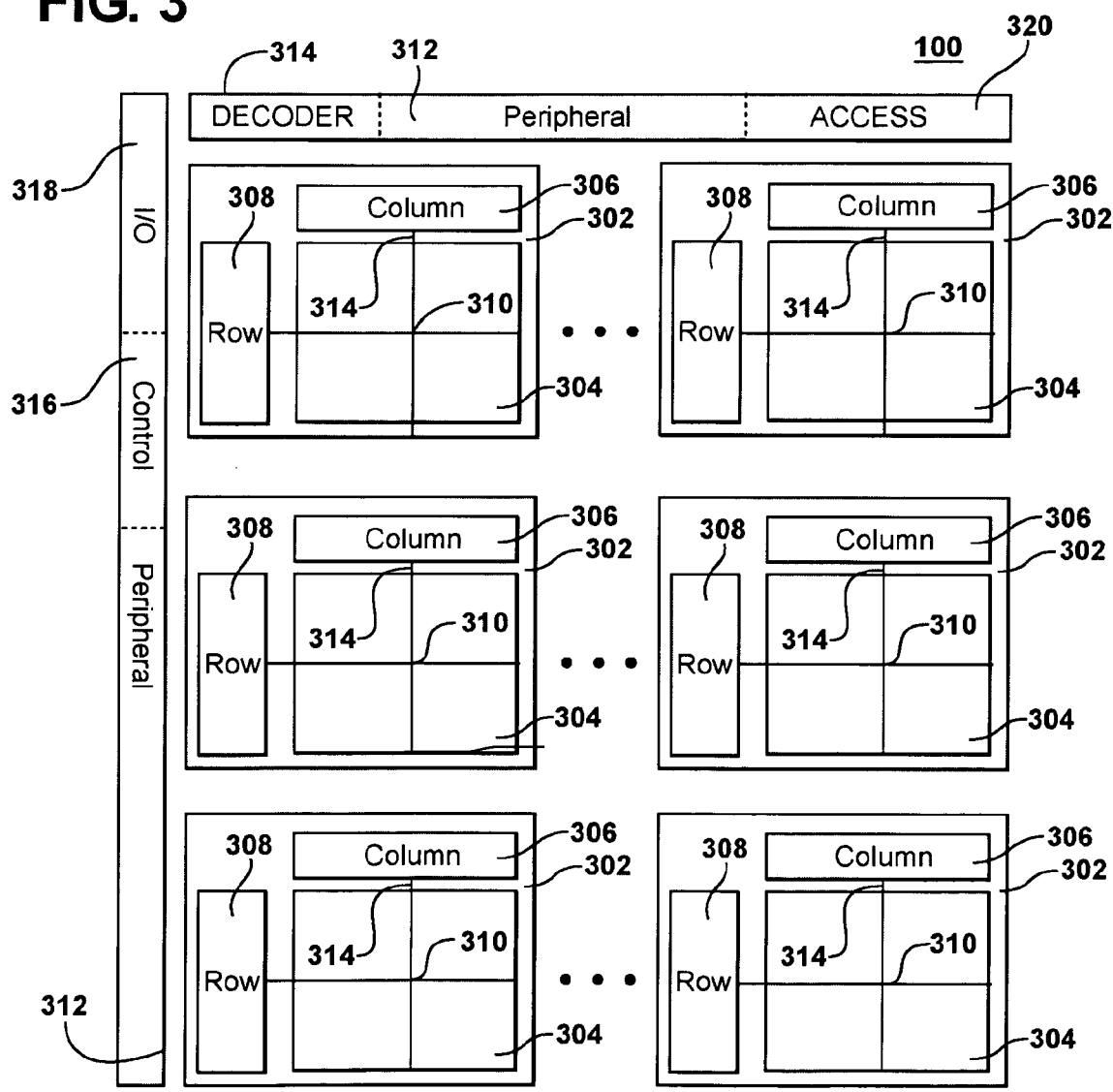
FIG. 3 is a block diagram of a multi-tiled embodiment of a memory array in accordance with the principles of the present invention.

The conceptual block diagram of FIG. 3 provides a functional level view of an illustrative standalone low-complexity memory circuit 100 in accordance with the principles of the present invention. In this illustrative embodiment, a standalone memory circuit 100 includes at least one array of programmable resistance memory cells arranged as a storage matrix tile 302, along with NMOS peripheral circuitry that, in combination, yields the standalone unipolar memory circuit 100.

The memory cells of the storage matrix 304 may be implemented as, for example, phase change memory cells. In this illustrative embodiment, the memory circuit 100 includes row drivers 308 and column drivers 306 configured to access cells within the storage matrix 304. The row 308 and column 306 drivers may be unipolar such as, for example, n-channel MOSFETs or p-channel MOSFETs. Row address, column address and data latches may also be included in the peripheral circuitry 312. Accesses carried out by the row 308 and column 306 drivers include reading from the memory cells of the matrix 304 and writing to the memory cells of the matrix 304. Peripheral circuitry 312 includes unipolar decoding circuitry 314 which accepts address signals and decodes the address signals to determine which of the row 308 and column 306 drivers to activate and, thereby, which of the memory cells within the array 304 to access.

Peripheral circuitry 312 may include control circuitry 316 that employs unipolar MOS logic which accepts READ, WRITE, and CLOCK signals and develops control signals for the standalone memory 100. The control signals developed for the memory 100 may include data direction control (e.g., "read from" or "write to" the storage matrix tile 302) and multi-phase clock signals, for example. In an illustrative embodiment the peripheral circuitry includes NMOS input/output circuitry 318 configured to accept data for writing to and to drive data read from the storage matrix tile 302.

Figure 4:
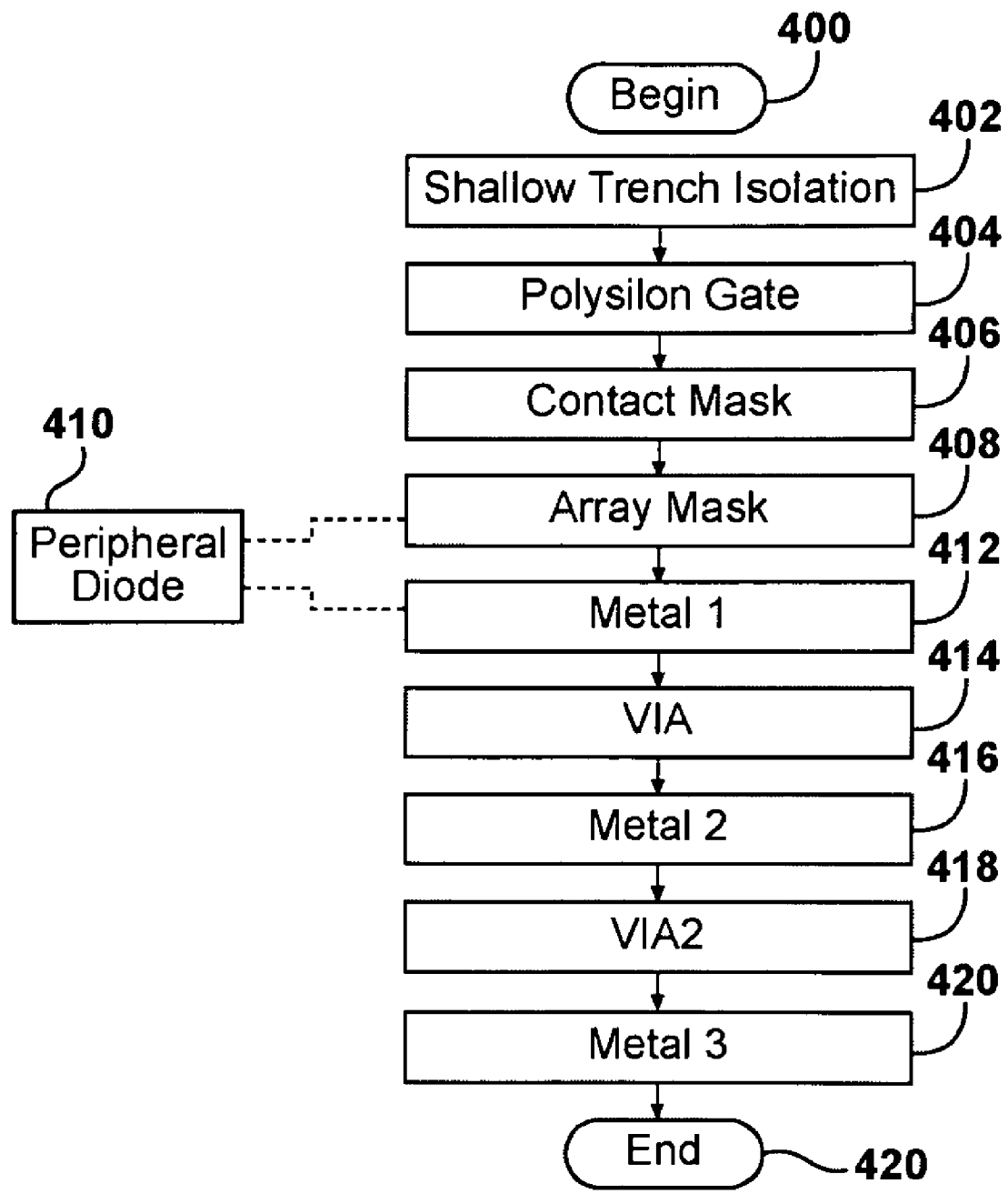
FIG. 4 is a flowchart that depicts the process of forming a unipolar MOS programmable resistance memory in accordance with the principles of the present invention.

The flowchart of FIG. 4 illustrates the general flow of a method that may be employed in the formation of an NMOS programmable resistance memory in accordance with the principles of the present invention. In particular, the flowchart chronicles the mask steps and associated sub-processes employed in such a method. In accordance with the principles of the present invention a low-complexity NMOS programmable resistance memory may be formed with as few as nine mask steps, only five of which are critical mask steps. As previously noted, there is a strong correlation between mask steps and the cost of producing an integrated circuit. This is particularly true of critical mask steps. By employing a low-complexity process, with only five critical mask steps and as few as four non-critical mask steps, a process in accordance with the principles of the present invention may be used to manufacture low-cost standalone programmable resistance memories.

In accordance with the principles of the present invention, NMOS power consumption is greatly reduced by limiting the extent of peripheral circuitry associated with the programmable resistance memory array. That is, in an illustrative embodiment, not only is the complexity of the formation process reduced in comparison with a conventional CMOS process, the extent and complexity of the peripheral circuitry associated with the programmable resistance memory array is also minimized, thereby reducing the power consumption of the peripheral circuitry, while further reducing the cost of the memory. The function(s) of peripheral circuitry eliminated from such a standalone memory may be offloaded to a memory controller integrated circuit, or "chip." The memory controller may provide such functionality for a plurality of low-complexity programmable resistance memories in accordance with the principles of the present invention. Additionally, an integrated circuit that performs the "offloaded" functions for a plurality of low-complexity programmable resistance memories and provides an interface to a standard memory controller may also be employed in accordance with the principles of the present invention.

The process of this illustrative embodiment begins in step 400 and proceeds from there to step 402 where a first mask step is performed to create shallow trench isolation regions within a substrate. This is a critical mask step.

Figure 5A:
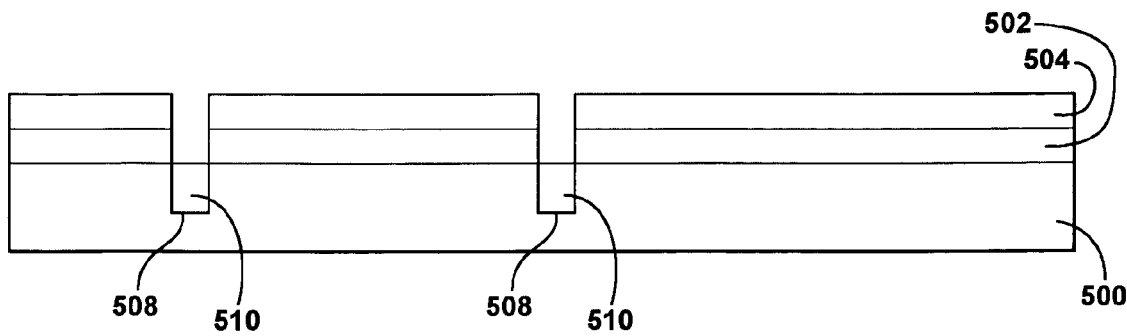
FIGS. 5A through 5O are cross sectional views depicting the structure of a unipolar MOS programmable resistance memory in accordance with the principles of the present invention during the formation process.
Figure 5B:
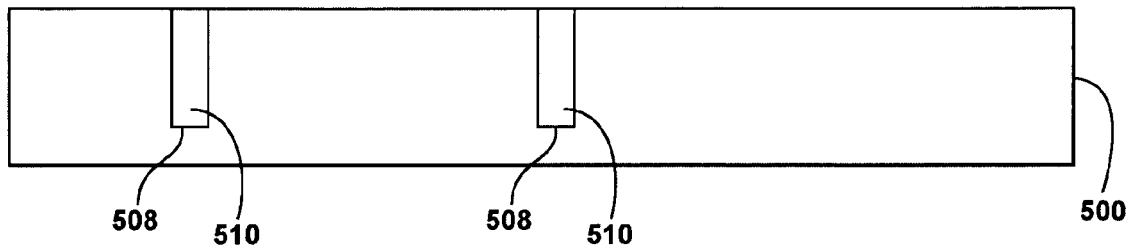
Figure 5C:
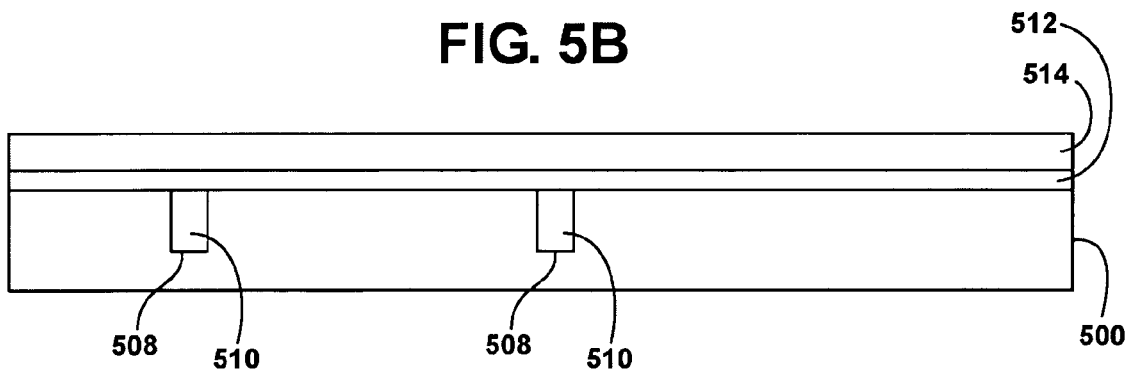
Figure 5D:
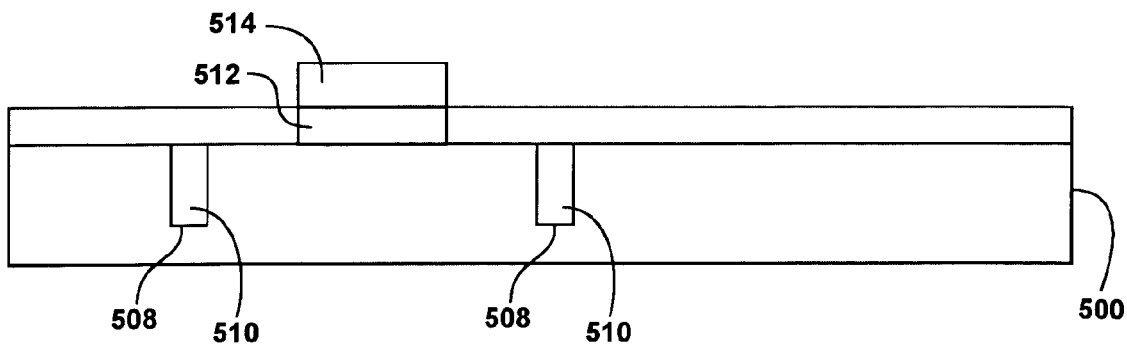
Figure 5E:
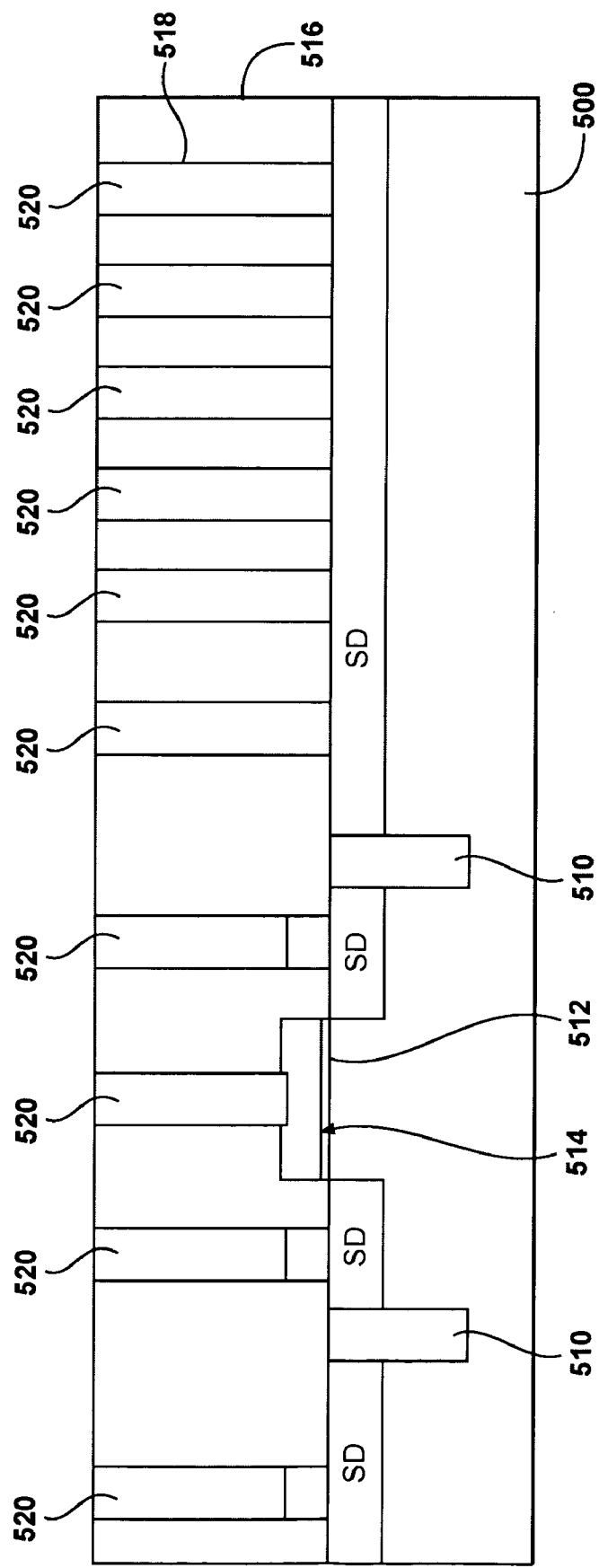
Figure 5F:
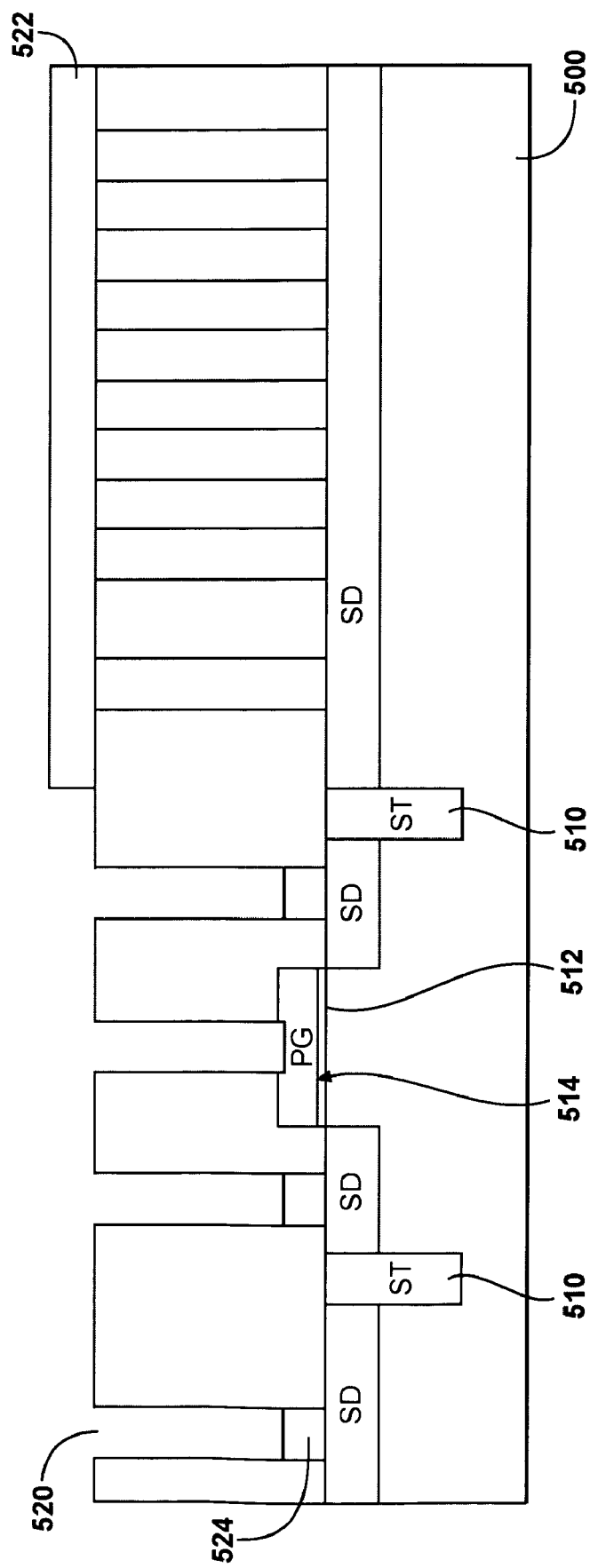
Figure 5G:
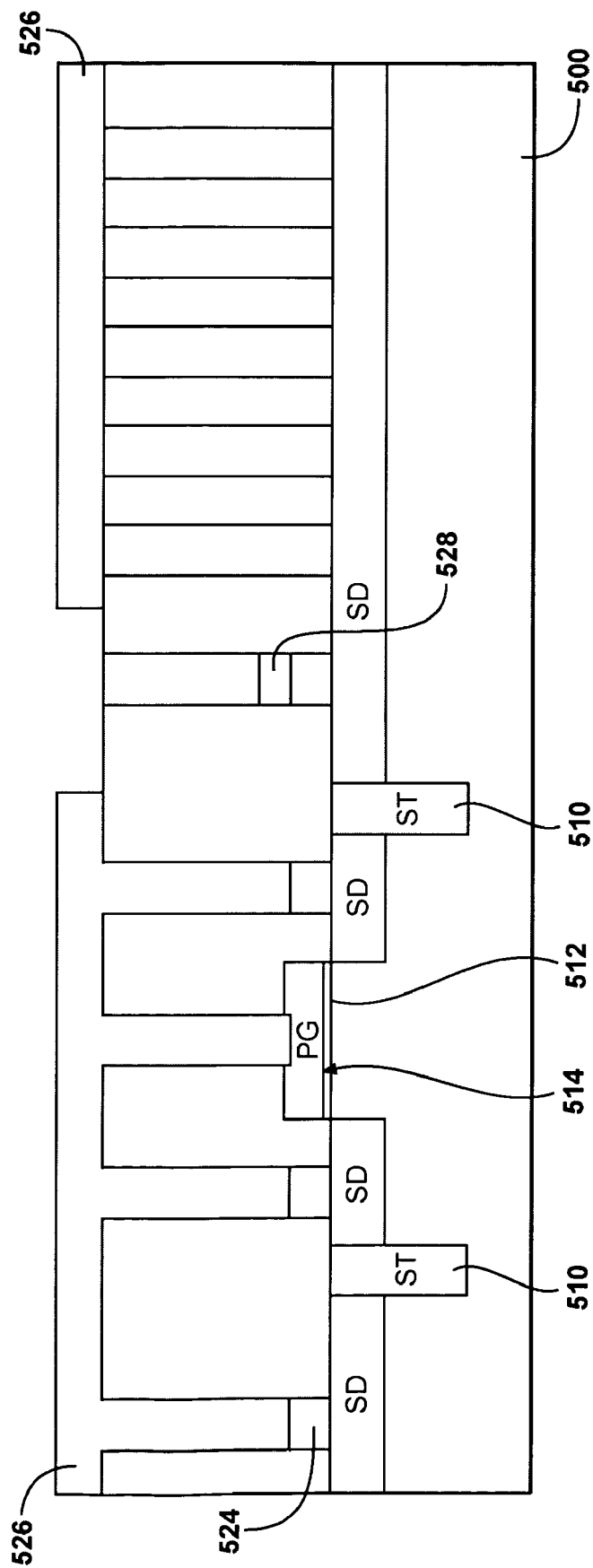
Figure 5H:
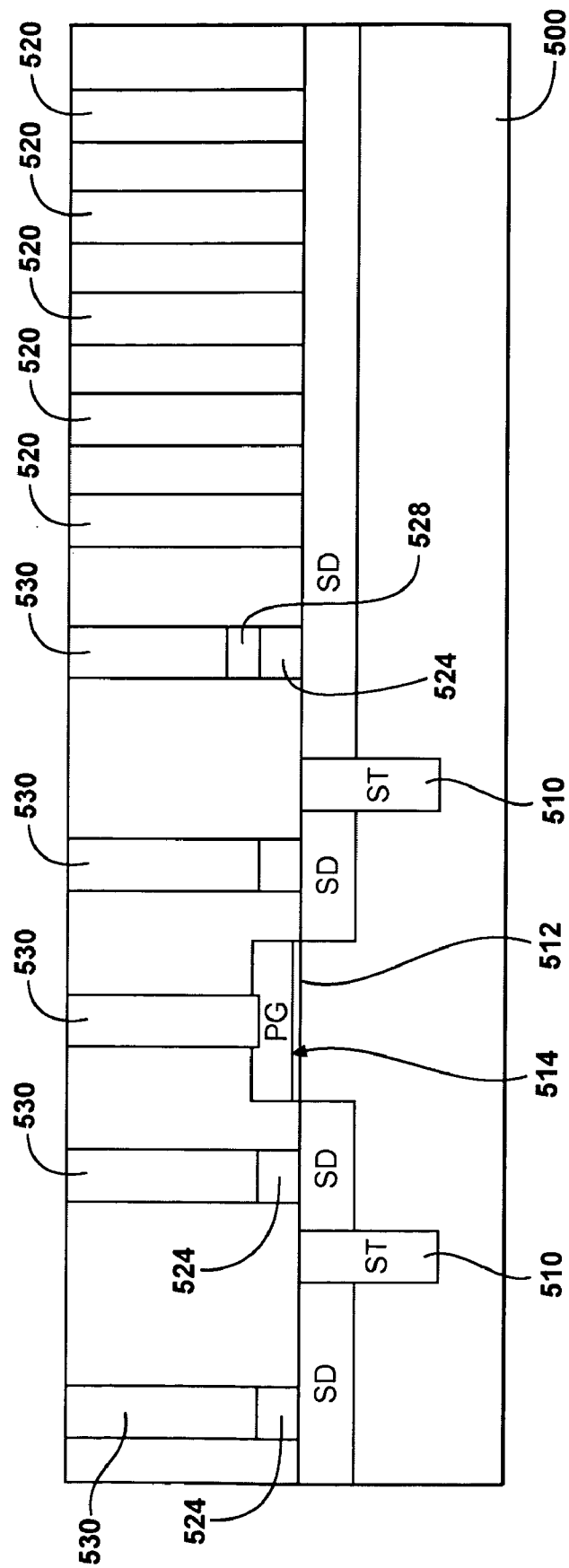
Figure 5I:
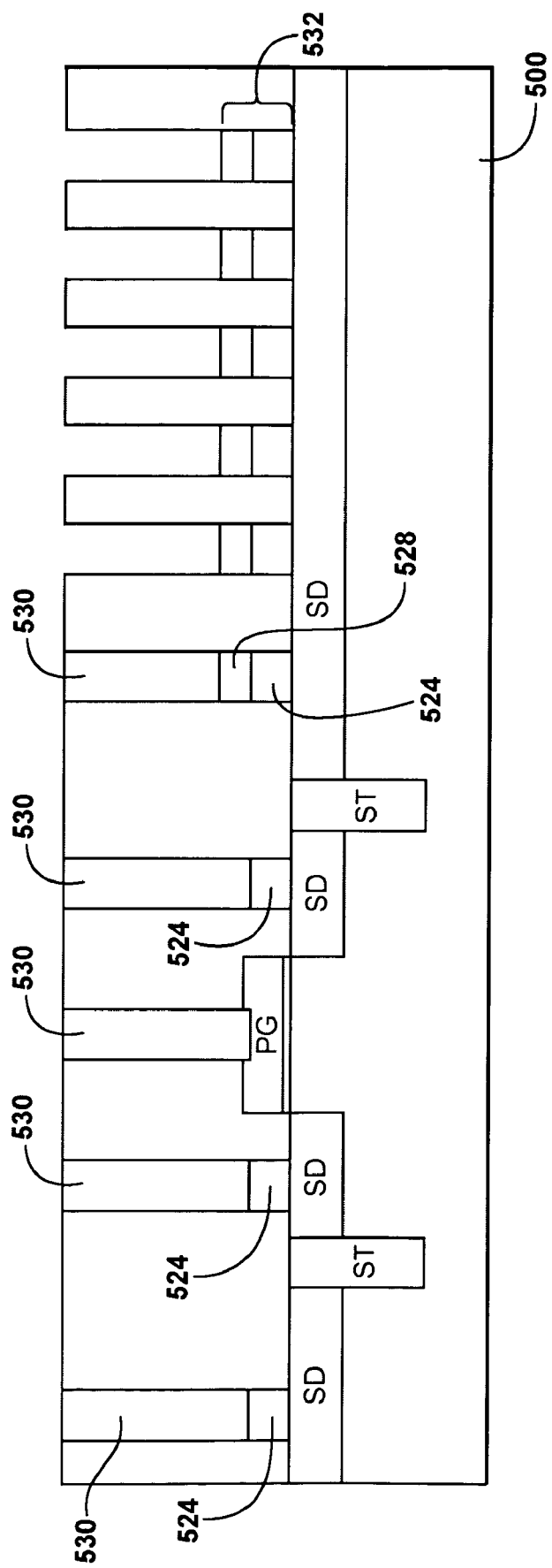
Figure 5J:
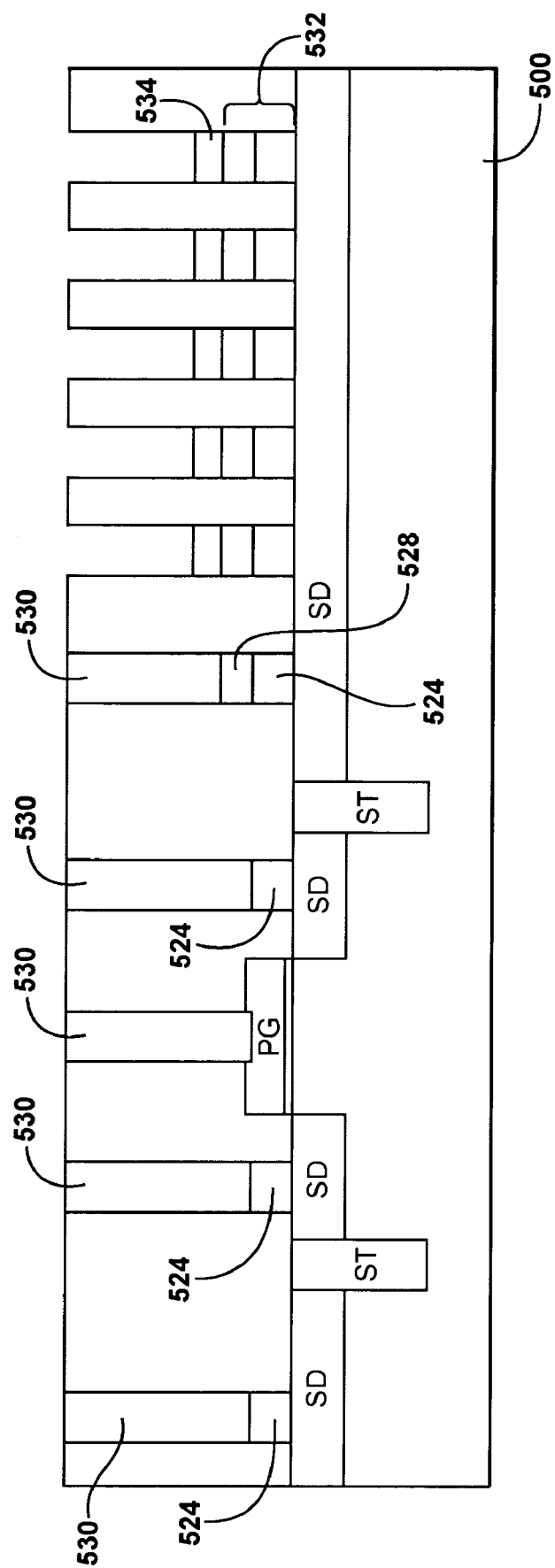
Figure 5K:
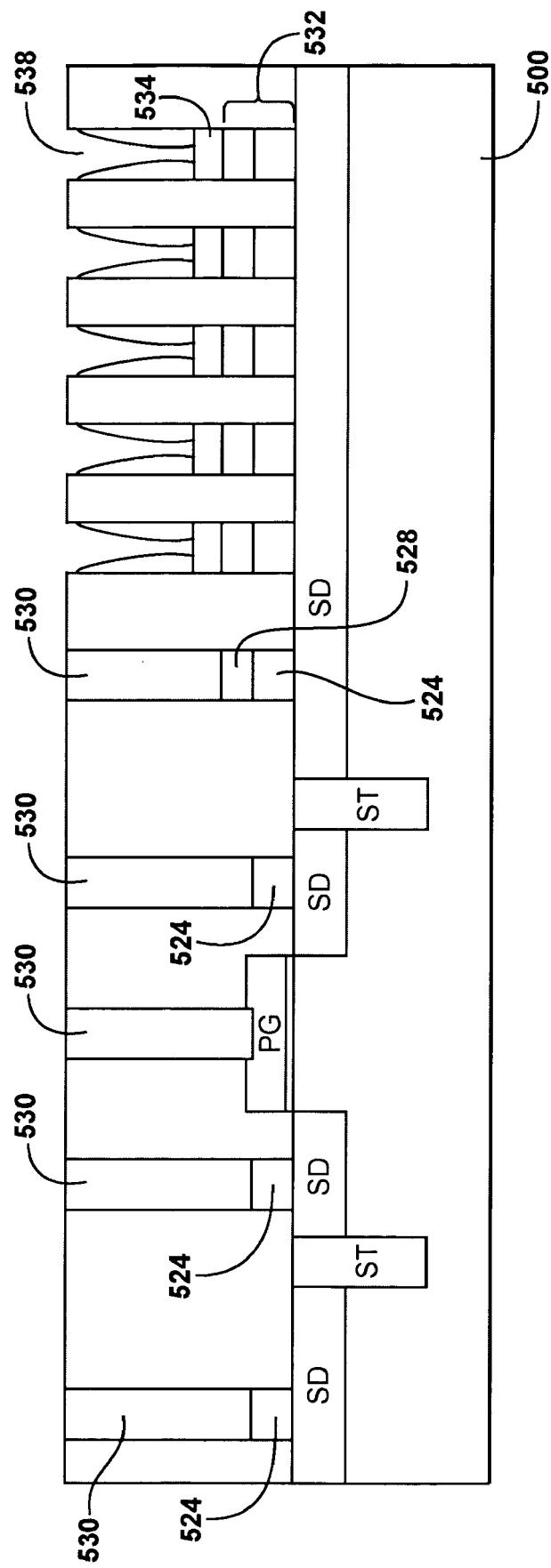
Figure 5L:
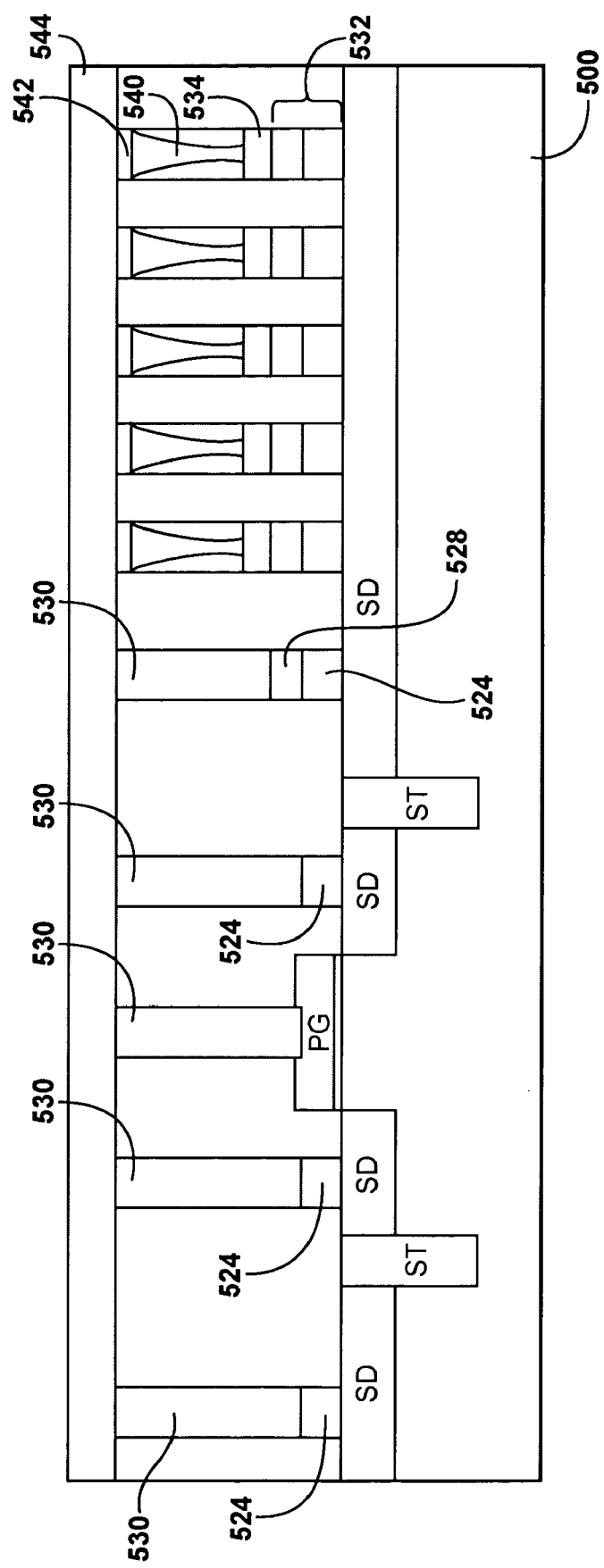
Figure 5M:
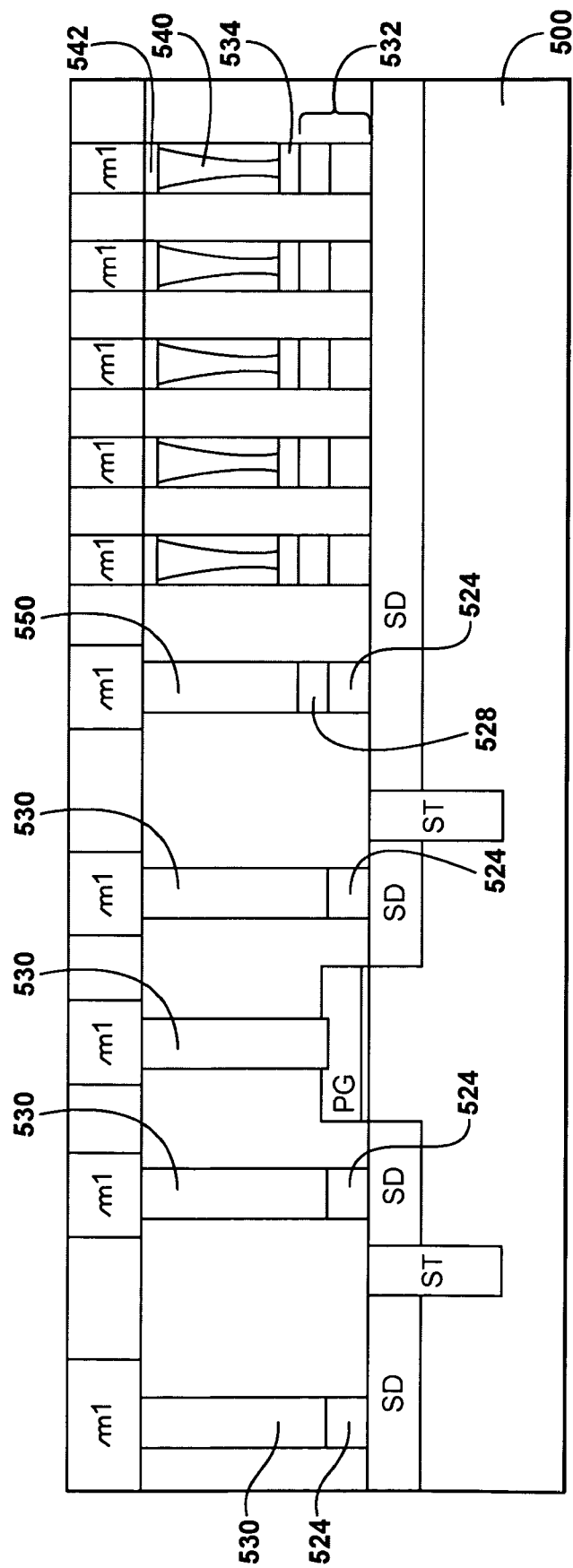
Figure 5N:
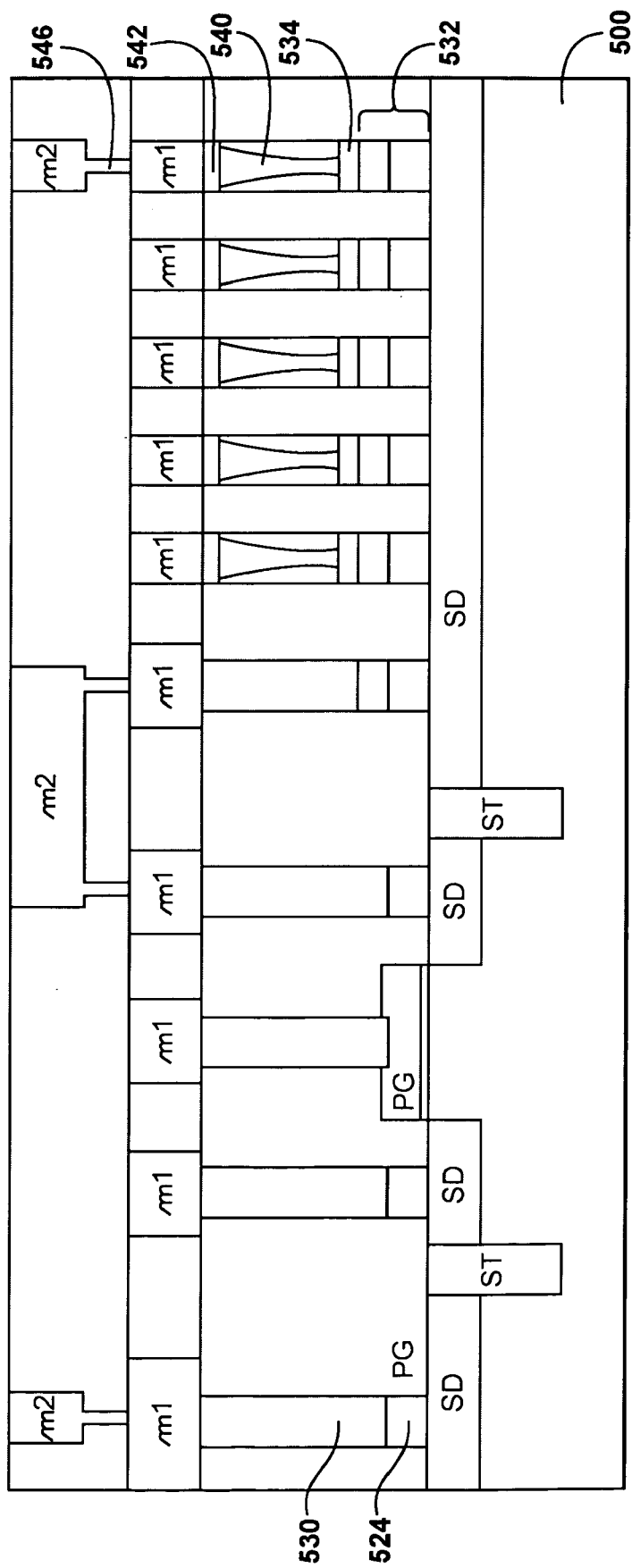
Figure 5O:
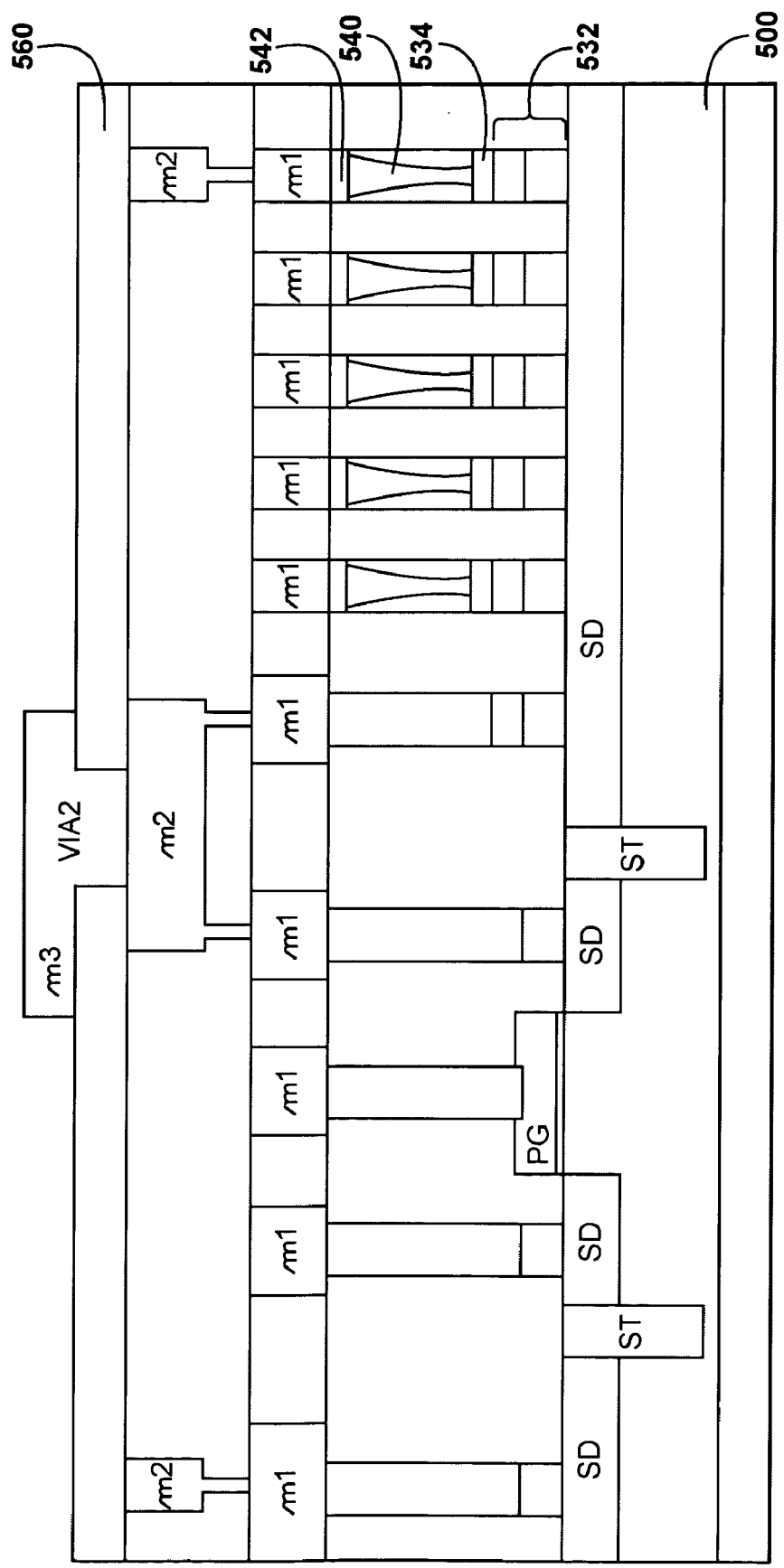

Features of an illustrative embodiment of a programmable resistance memory in accordance with the principles of the present invention generally corresponding to this and other mask steps are depicted in the cross-sectional views of FIGS. 5A through 5O. In particular, features related to this mask step are depicted in FIGS. 5A and 5B. As is known in the art, a substrate 500 such as a single-crystal silicon wafer may be prepared for processing before the mask step 402, for example, by employing any of a variety of cleaning steps. Shallow trench isolation is employed, for example, to electrically isolate individual transistors or diodes within electronic circuitry, such as the circuitry employed to access memory cells within an array in accordance with the principles of the present invention. Additionally, trenches may be formed to separate diode anode regions that are employed to access lines (e.g., rows or columns) of memory cells within a memory array in accordance with the principles of the present invention. In an illustrative embodiment, the formation of shallow trench isolation structures includes the process of forming a shallow trench isolation photoresist pattern, etching the underlying substrate according to the pattern of the mask and filling the isolation trenches with dielectric material.

Because a hard mask is less susceptible to contamination during the etching and resist strip process, a hard mask process is employed in forming shallow trench isolation features in accordance with the principles of the present invention. In such a process, as illustrated in the cross sectional view of FIG. 5A, a barrier oxide 502 is formed on the top surface of the substrate 500. A nitride layer 504 is then formed over the barrier oxide layer 502. A photoresist layer (not shown) is formed over the nitride layer 504 and patterned to define the areas of the underlying substrate that will be etched away to form isolation trenches 508. The nitride 504 and oxide 502 layers are then etched to form a hard mask. The photoresist layer is then stripped. As is known in the art, in order accelerate etching of the silicon substrate 500 a different chemistry (e.g., one that employs Cl2 and/or HBr) may be employed in the etching process once the hard mask is formed. The etching process continues until the isolation trenches 508 are formed within the substrate 500. The trenches 508 are then filled with a dielectric material, such as silicon oxide using, for example CVD, to effect the desired electrical isolation among circuit components formed within the substrate 500.

After the trenches 508 are filled with dielectric material 510, a planar surface may be created by chemical/mechanical polishing (CMP), for example. The silicon nitride layer 504 may be used as a polish stop to protect the silicon substrate during the CMP process. After planarization, the silicon nitride layer may be removed, using hot phosphoric acid, for example, leaving the structure of FIG. 5B. Various implants, such as a blanket well implant, may be performed after the removal of the silicon nitride layer, for example. In preparation for the formation of NMOS gates, an NMOS gate dielectric layer 512 may then be grown, followed by the deposition of gate conductor material layer 514, yielding the structure of FIG. 5C. The gate conductor material 514 may be deposited using a CVD process and may include a conductor known in the art, such as doped polysilicon, tungsten, WSix or similar refractor metals a/o silicide material, or combinations of these materials, for example. The gate dielectric may include silicon dioxide, silicon oxynitride, hafnium silicate or other insulating materials, for example.

After growth of the gate insulation layer 512 and deposition of the gate conductor material layer 514, the process proceeds to the gate mask step 404. In the gate mask step 404, a non-critical mask step, a mask is formed to define the NMOS circuitry's gate areas. Exposed gate conductor areas outside the mask are etched away, leaving gate conductor 514 only in the NMOS gate locations, as in the illustrative embodiment of FIG. 5D. The mask is stripped after gate formation. Following optional spacer formation at the gate conductor edges, a highly doped drain (HDD) implant (using, for example, As for the implant species) is carried out to form the source and drain regions SD of the NMOS circuitry. As previously noted, the SD regions of NMOS transistors used in peripheral circuitry (outside the memory array) are separated by the previously formed shallow trenches and are created by this implant in areas not occupied by the trenches. After such an implant, an oxide layer 516 may be deposited and, from that point in the process, another mask step is carried out in step 406.

In step 406, a critical mask, referred to herein as the Contact mask, is formed and used to define openings 518 within the oxide layer 516 that, when filled with a conductor, will provide "vertical" electrical access to the source/drain and gate regions within the substrate. Openings within the oxide will also support vertical structures, such as isolation diodes and programmable resistance memory cells, for example. After forming the mask and etching the openings, an epitaxial layer of silicon 520 is grown within the openings. The top surface is then planarized using a CMP process, leaving the structure of FIG. 5E.

From step 406 the process proceeds to step 408 where a non-critical mask, referred to herein as a Array mask 522, is employed to shield the area within which the device's programmable resistance memory array will be formed. With the Array mask 522 in place, the epitaxial silicon within the openings 520 that overlie the peripheral circuitry is etched back. The etching process is stopped before reaching the silicon substrate, yielding openings with partial epitaxial fill 524, as in the structure depicted in FIG. 5F. At this point an optional, non-critical, mask step may be performed to form diodes, referred to herein as peripheral diodes. In an optional illustrative embodiment, the peripheral diodes are employed in a programmable resistance memory's address decoding circuitry.

In the optional, non-critical, mask step 410, referred to herein as the Peripheral Diodes mask step, a mask 526 is formed to mask off all regions other than those where the peripheral diodes are to be created. After forming the mask 526, epitaxial silicon within the exposed openings is etched back, leaving sufficient silicon with which to form a diode. After etching, the epitaxial silicon is implanted to form a P+ region 528 within each peripheral diode opening, thereby completing the formation of the peripheral diodes, as depicted in the cross sectional view of FIG. 5G. The Peripheral Diodes mask is then stripped.

Next, a layer of Ti/TiN is deposited using, for example, PVD a/o CVD processes. A blanket tungsten layer is then deposited using, for example, a CVD process to thereby fill the openings within the oxide layer with tungsten 530 and provide electrical connection to the gate, source, and drain regions of the NMOS peripheral circuitry and to the anodes of the peripheral diodes. In this illustrative embodiment, the tungsten layer is then planarized using a CMP process, as reflected in the structure of FIG. 5H. A blanket etch in which silicon is etched selectively to tungsten is then performed. The result of this etching is that the tungsten 530 within the peripheral circuit openings is left substantially intact while the epitaxial silicon filling the memory-cell openings is etched back. In this etch, enough epitaxial silicon is left in the memory-cell openings to form diodes within each opening. The diodes thus-formed will act as access device diodes for the associated programmable resistance memory elements formed above them. Subsequent to the etch, a P+ implant, using boron for example, is employed to form the access device diodes 532. Such a structure is depicted in FIG. 5I.

Cobalt silicide 534 is then selectively formed atop the isolation diodes using a Co dep, thermal reaction, and selective strip formation process as is well known in the art. The cobalt silicide layer will operate as the bottom contact for the respective memory elements, as in the structure of FIG. 5J.

In an illustrative embodiment silicon nitride spacers are formed on the perimeter of each array contact structure, as shown in FIG. 5K. In this illustrative embodiment, the silicon nitride layer is used to form a confining structure 538 for the programmable resistance memory material. The confining structures 538 are filled with programmable resistance material using a deposition such as PVD or CVD. Such confining structures define a smaller volume than the memory-cell openings themselves, and may be formed at sub-lithographic dimensions. As is known in the art, a memory cell that uses a smaller volume of programmable resistance material may require substantially less power to operate than a memory cell that uses a larger volume of programmable resistance material. A planarization, such as CMP is then performed to remove the programmable resistance material 540, such as GeSbTe 225 for example, from all regions except within the confined structures regions 538.

Next a top electrode 542 for the programmable resistance material, for example TiN or TiAlN, is formed by performing a recess dry or wet etch, top electrode deposition, such as by PVD or CVD, and a CMP planarization. A blanket oxide layer 544 may then deposited in preparation for forming the memory's first metal interconnect layer, yielding the structure of FIG. 5L.

In another embodiment, an optional breakdown layer, that is, a thin layer of dielectric material, may be deposited prior to programmable resistance material deposition. In such an embodiment, the breakdown layer dielectric material serves to further reduce the active volume of the programmable resistance material.

From step 408 (or optional step 410), the process proceeds to the next mask step, step 412, where the first metal layer, M1, mask is formed. This is a critical mask step. The oxide layer formed in the previous step is etched according to the mask in order to form trenches that define the M1 interconnect lines. In an illustrative embodiment, copper is use as the metal interconnect material. A damascene process, such as is known in the art may be employed to form the copper interconnect. In such a process, a tantalum nitride (TaN) barrier layer is deposited using CVD, for example. The M1 trenches are then filled with copper by an electroplating process. The barrier layer (not shown in the Figures) acts as a barrier between the surrounding dielectric material (and top electrode material) and the copper that forms the M1 interconnect. After Cu filling of the trenches, a CMP planarization is performed. After forming the M1 interconnect (as depicted in the structure of FIG. 5M) a blanket oxide layer is deposited in anticipation of forming a second metallization layer M2 and the vias that connect the M1 and M2 interconnection patterns.

The process proceeds from step 412 to a via mask step 414, which is also a critical mask step. In step 414 a via mask is formed and vias holes 546, also referred to herein simply as "vias," are etched. After the vias 546 are etched, the via mask is removed and the process proceeds to step 416 where the second metal interconnect layer M2 mask step takes place.

In step 416 the second layer interconnect mask is formed and the M2 trenches are etched. The second layer metal mask step is also a critical mask step. As is known in the art, various techniques are available to ensure that the vias 546 formed in step 414 align with target metallization lines in both the M1 and M2 interconnect layers. Using a dual damascene process known in the art, after oxide etching of trenches, a TaN barrier layer is deposited within the M2 trenches and the vias 546 formed in step 414. Such a deposition may employ a CVD process, for example. After deposition of the TaN barrier layer, copper may be electroplated, thereby filling the M2 trenches and vias 546 in a single step. Next a CMP planarization is performed yielding the structure of FIG. 5N. A layer of silicon nitride 560 is then deposited. The process then proceeds to mask step 418 where an Via2 mask step is performed.

The Via2 mask step 418 is a non-critical mask step. In this step the Via2 mask is formed, the nitride layer 560 is etched to expose select M2 regions, and a blanket Al metal layer is deposited After depositing the blanket Al metal layer the process moves to step 420 where the metal 3 mask step takes place.

The third level metal M3 mask step, a non-critical mask step, involves the formation of the M3 mask, and etching away the metal exposed by the mask down to the nitride layer 560. In an illustrative embodiment, a dry etch is employed in this step. The remaining metal may be used, for example, to form bonding pads that connect, typically with wirebonds, the input/output circuitry of the memory array to an external package which, in turn, may include connection devices such as bumps (for bump-boding devices), legs (for through-hole package devices), or any of a variety of surface contacts (for surface mount devices), for example. The resultant structure is depicted in the cross section of FIG. 5O.

From step 420 the process proceeds to end in step 422. FIGS. 5A through 5O have been described in conjunction with the discussion related to the flow chart of FIG. 4.

Figure 6:
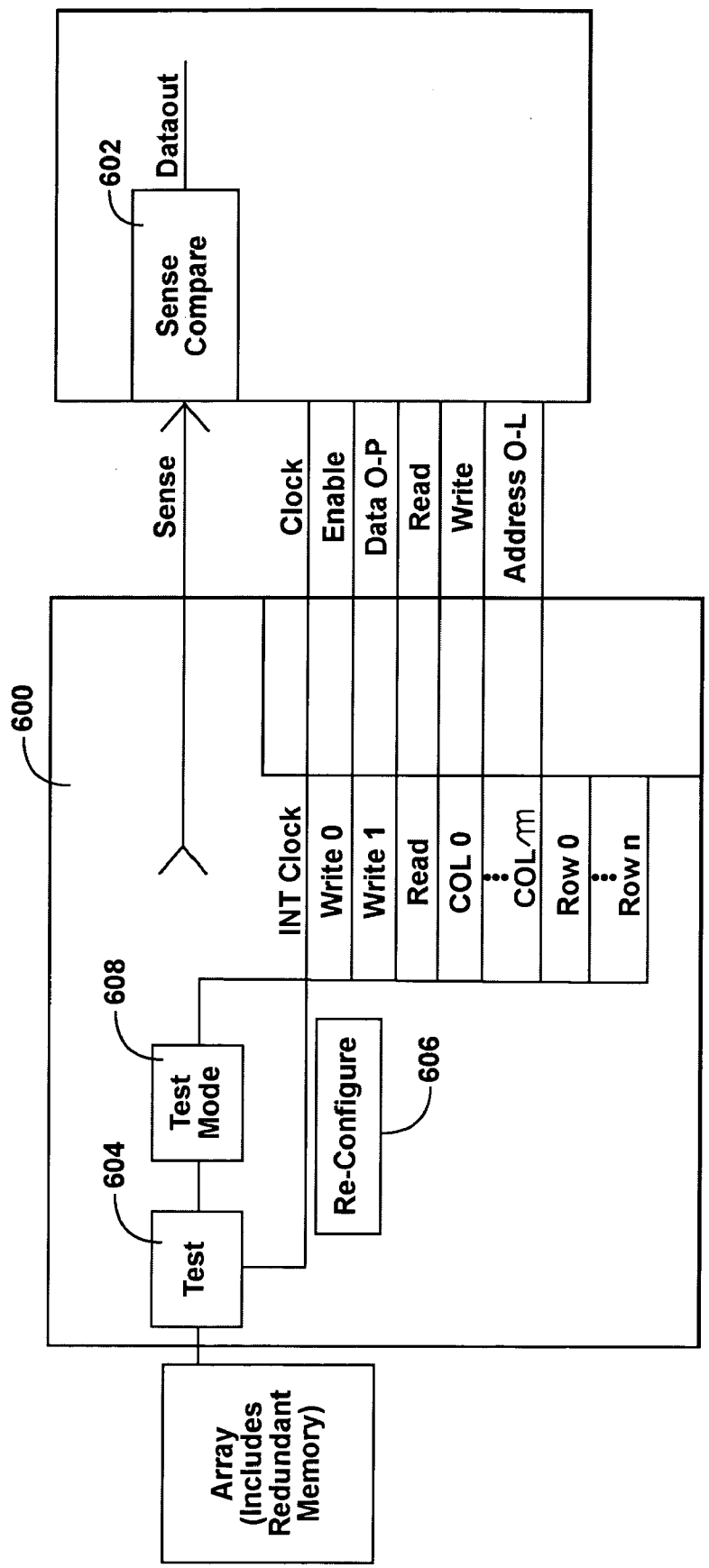
FIG. 6 is a block diagram of a unipolar MOS programmable resistance memory/controller combination in accordance with the principles of the present invention.

FIG. 6 is a conceptual block diagram of a input/output and control (I/O) interface 600 such as may be employed by a standalone memory in accordance with the principles of the present invention. In this illustrative embodiment a sense signal SENSE is sent "off-chip" to a sense and compare circuit located on a chip other than the standalone memory. The sense and compare circuit 602 accepts the SENSE signal and converts it from an analog signal to a digital signal, thereby developing a digital data output signal(s) for a memory in accordance with the principles of the present invention. The sense and compare circuit 602 may be included, for example, in a memory controller circuit, such as is described in greater detail in the discussion related to FIG. 8.

The SENSE signal, which is indicative of an accessed memory cell's programmed level (manifested, for example, as a voltage level for a cell that exhibits different values of resistance according to its programmed level and to which a current source is delivered for sensing), may be taken from a node "directly atop" an array's column line. In an illustrative embodiment, with a unipolar MOS column driver turned "ON" in order to access a cell and a current supplied to an OUM cell by a unipolar MOS device activated by a READ signal, the voltage at that node, which is also the SENSE voltage, is approximately the product of the current through the programmable resistance material multiplied by the resistance of the programmable resistance material plus an offset voltage attributable to the unipolar MOS column driver and isolation device (e.g., an epitaxial diode).

Data lines DATA0-DATAP, address lines ADDRESS0-ADDRESSL, and READ and WRITE control signals are received by the I/O circuit 600 and converted to WRITE0, WRITE1, READ, COL0-COLm, and ROW0-ROWn signals. Although only two-level storage, corresponding to WRITE0 and WRITE1, is employed in this illustrative embodiment, a memory in accordance with the principle of the present invention may employ a scheme whereby each memory cell within a memory array is capable of taking on any one of more than two prescribed levels (resistance or voltage levels, for example), corresponding to a data content of more than one bit per cell.

The I/O circuit 600 also receives a clock input from which it develops internal timing and control signals. The internal clock INT CLOCK may include one or more signals that control the latching of data or intermediate results, for example. A control input ENABLE may be employed by external circuitry to enable the memory in a conventional fashion, for example, to enable the phase change memory after a power-on-reset sequence has been completed.

The I/O circuit 600 may also include test mode support that may operate in conjunction with a memory controller to test operation of the standalone memory. Such testing may include built in self tests. Built in self tests are known and described, for example, in "COMPREHENSIVE STUDY ON DESIGNING MEMORY BIST: ALGORITHMS, IMPLEMENTATIONS AND TRADE-OFFS," by Allen C. Cheng, Department of Electrical Engineering and Computer Science, The University of Michigan, which is hereby incorporated by reference.

In accordance with the principles of the present invention, the I/O circuit 600, located on a standalone memory 100, may include circuitry that allows a standalone memory 100 in accordance with the principles of the present invention to off-load functionality to external circuitry, such as an external controller, for example. In an illustrative embodiment, the I/O circuit 600 includes a test register 604, a reconfiguration register 606, and a test mode register 608. A standalone memory 100 in accordance with the principles of the present invention may also include test pads that permit external circuits to probe and exercise components of the memory 100. Such circuitry allows a standalone memory in accordance with the principles of the present invention to be configured for operation with an external controller. For example, the test register 604 may be configured to receive input from an external device, such as patterns that may be used to "exercise" memory elements within the memory array and to thereby uncover faulty elements. Results of the exercising/testing process may be evaluated in an external circuit, such as a memory controller that is configured for operation with standalone unipolar MOS programmable resistance memories in accordance with the principles of the present invention. The reconfiguration register 606 may be devised to operate in conjunction with an external controller to reconfigure portions of the memory array in response to test results. That is, for example, an external controller may identify a fault within a segment of the memory array 100, and in response, provide memory mapping information to the reconfiguration register 606 that allows the reconfiguration register to map redundant memory within the memory array 100 into the "active" memory-mapped space of the memory 100 and to map the faulty memory segment out of the active memory-mapped space.

In accordance with the principles of the present invention, a test mode register 608 includes test mode instructions that may be used by the memory 100 to implement one or more test modes. For example, a standalone memory 100 may cycle through memory locations using a nested do-loop of column, then row (or, row then column) addresses to implement a memory test. In accordance with the principles of the present invention, a unipolar MOS counter may be used to increment the row and column addresses employed within a nested do loop. In this manner, an external controller may initiate a memory test without being burdened with the task of updating addresses and test patterns to cells within the memory 100. Test patterns employed by the memory 100 may include: "all 1s", "all 0s", checkerboard, and checkerboard complement, for example, and a test code stored within the test mode register 608 may determine which of the test patterns to employ.

The on-chip address-generation circuitry may also be employed to implement a self-refresh mode, whereby the memory 100 cycles through a do loop of column, then row (or row, then column) addresses and reads then rewrites (with the same data) the active cells within the array 100. Such a self-refreshing process may be initiated, by a memory controller, for example, at strategic times, such as during system power up or power down. A memory 100 in accordance with the principles of the present invention may include input protection circuits, high speed data interface circuits for communications with an external controller, address transition detection circuits for operation with an external controller and user-selectable operating mode detection circuits for operation with an external controller.

Figure 7:
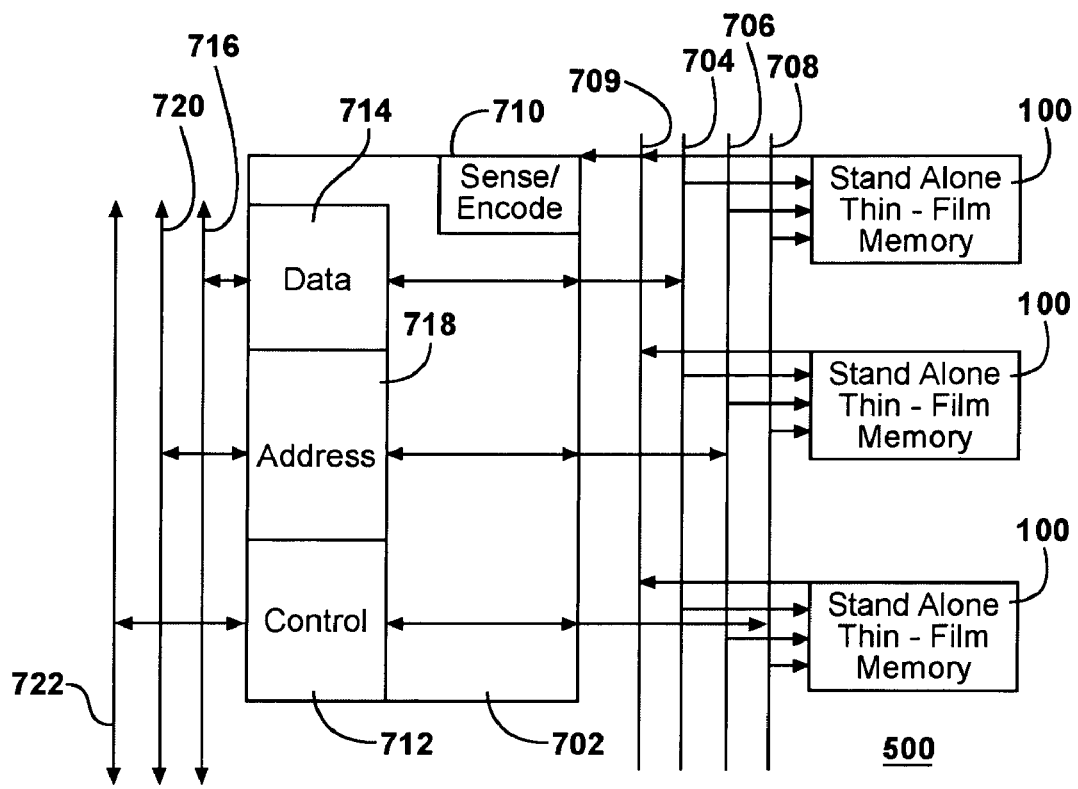
FIG. 7 is a block diagram of a memory controller such as may be used in conjunction with a unipolar MOS programmable resistance memory in accordance with the principles of the present invention.

The conceptual block diagram of FIG. 7 illustrates a memory system 700 in accordance with the principles of the present invention. The memory system 700 includes at least one standalone unipolar MOS programmable resistance memory 100 in accordance with the principles of the present invention, such as described in greater detail in the discussion related to previous figures. A standalone memory controller 702 in accordance with the principles of the present invention is connected through DATA 704, ADDRESS 706, and CONTROL 708 busses to the one or more standalone memories 100.

In this illustrative embodiment the standalone memory controller 702 includes at least one sense amplifier and encoder 710 configured to receive analog data from the memory 100 to convert it from analog to digital form and to encode the data represented by the analog signal. The sense/encode circuit 710 assigns different binary values, that is, encodes differently, an analog signal received from the memory 100, depending upon whether the memory 100 is configured as a binary, quaternary, or other "n-ary" memory. That is, the encoding process reflects the fact that an analog voltage signal corresponding to a given resistance within a memory cell may be assigned one digital value for a binary memory operation but a different digital value for a quaternary memory operation, for example.

In an illustrative embodiment, the memory controller 702, through its control circuit 712, coordinates access to analog data from each standalone memory 100. Each standalone memory 100 may provide multiple analog outputs, one for each data line, for example, and the memory controller 702 may accommodate the multiple analog lines by employing an analog multiplexer to feed analog signals from a number of analog data lines to a lesser number of sense amplifier/encoders. Alternatively, the controller 702 may match the number of sense amplifier/encoders to the number of analog data lines from the standalone memory 100, which may be equal to the number of data lines, or the controller 702 may provide more sense amplifier/encoders than the number of analog data lines in order to expedite the analog-to-digital conversion and encoding processes, and/or to provide capacity for additional optional standalone memory capacity upgrades.

Figure 10:
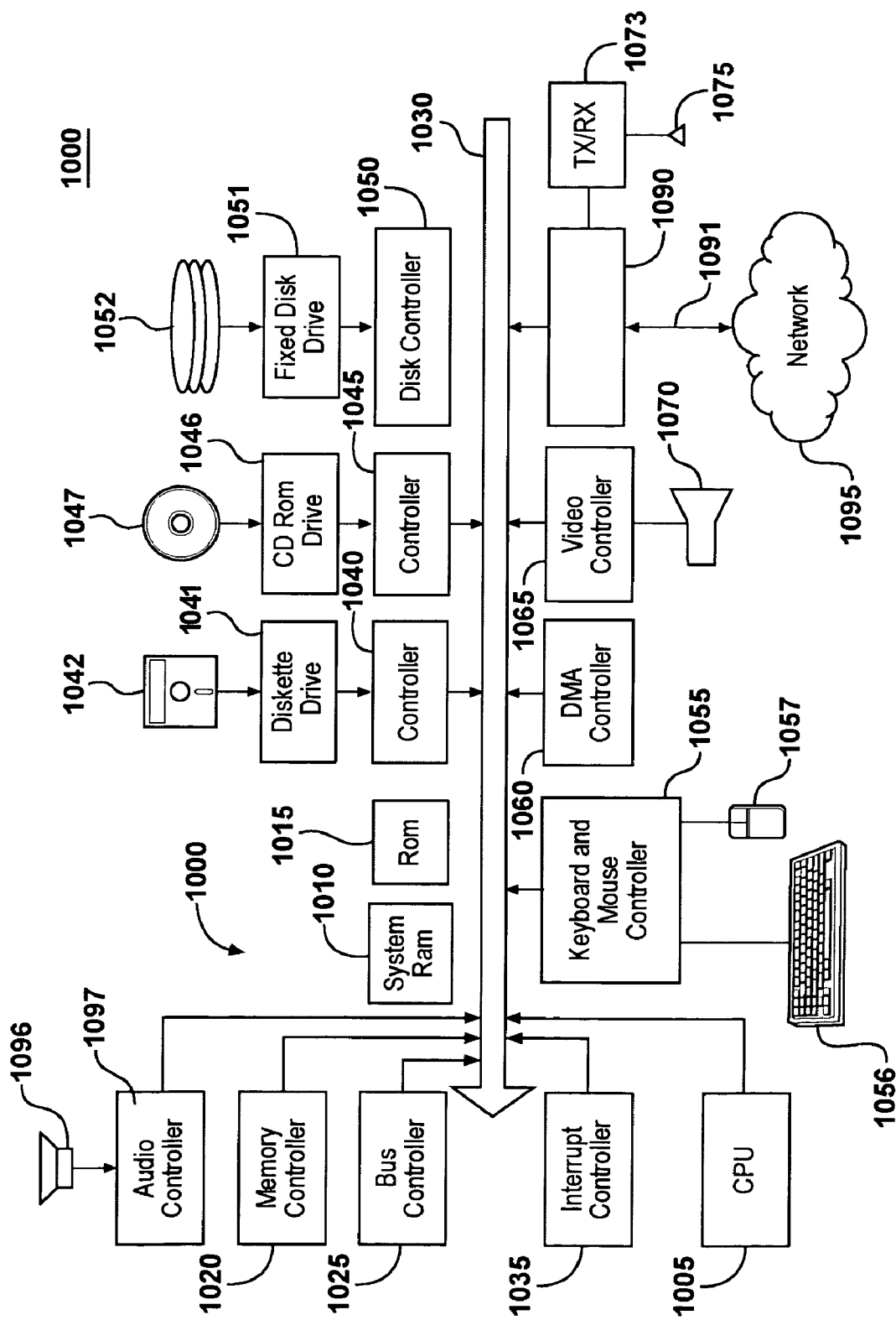
FIG. 10 is a conceptual block diagram of an electronic system such as may employ standalone unipolar MOS programmable resistance memories in accordance with the principles of the present invention.

Encoded digital data from the sense amplifier/encoder circuit 710 is provided to the data block 714 which provides an interface with an external data bus 716, such as data bus 1030 described in greater detail in the discussion related to FIG. 10. The data block 714 may include buffers and other associated circuitry configured to match the data rate of the one or more memories 100 to the data rate of the external data bus 716.

The control circuit 712 may include one or more output enable signals that control access to the analog bus 709 in a manner that prevents contention. In this illustrative embodiment, the output enable signal(s) are among the previously described enable signal(s) provided to a standalone memory 100. Address circuitry 718 provides an interface between an external address bus 720 and the memory address bus 706. The address circuitry 718 translates addresses presented on the external address bus 720 into addresses appropriate for each of the standalone unipolar memories 100 within the memory system 700. Control circuitry 712 provides an interface with an external control bus 722 and, in that capacity, develops control signals, including clock and enable signals for delivery to standalone memories 100 through the memory control bus 708.

Functions, and associated circuits, that might otherwise be performed on each of the standalone memories 100 may be concentrated on the memory controller 702, thereby reducing the cost of production for each of the memories 100, while only incrementally increasing the cost and complexity of the controller 702. The memory controller 702 may itself be a unipolar MOS device or it may be produced using a more conventional technology, such as complementary metal oxide semiconductor (CMOS) technology. In an illustrative embodiment, the memory controller 702 comprises at least two integrated circuits: one, standard, "off-the-shelf" memory controller and another that operates as an interface between a plurality of standalone unipolar MOS programmable resistance memories in accordance with the principles of the present invention.

Figure 8:
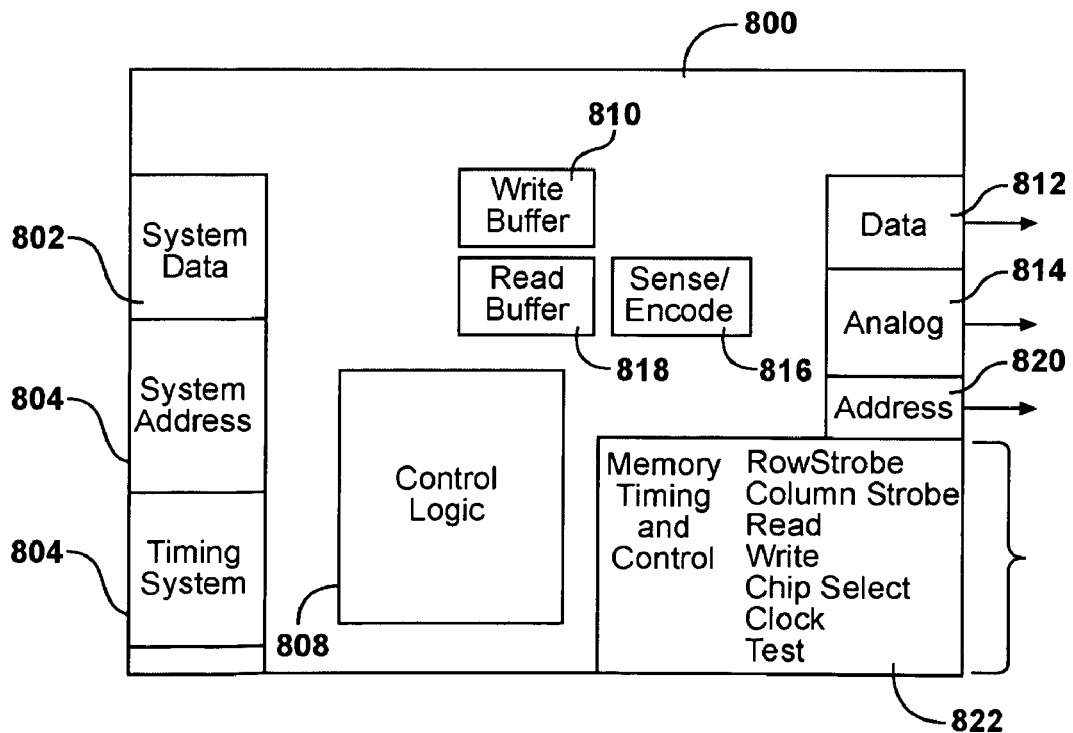
FIG. 8 is a more detailed block diagram of a memory controller such as may be used in conjunction with a unipolar MOS programmable resistance memory in accordance with the principles of the present invention.

The conceptual block diagram of FIG. 8 depicts a memory controller 800 in accordance with the principles of the present invention. The memory controller 800 is adapted for operation with standalone unipolar MOS programmable resistance memories in accordance with the principles of the present invention and, as such, includes functional elements that allow each standalone memory to offload functionality to the controller 800 and thereby reduce the complexity and cost of the standalone memories serviced by the controller 800.

The controller 800 includes system data 802, system address 804, and system timing and control 806 bus interfaces. Control logic 808 directs execution of the memory controller 800. A write buffer 810 operates as temporary storage for data that is to be written to memory (such as one or more standalone memories 100) through a data interface 812. An analog interface 814 accepts analog input from one or more standalone memories. In an illustrative embodiment, each analog input value is an analog voltage that is representative of the resistance of a selected memory device. The analog interface 814 may include signal conditioning or buffering circuitry, for example. Analog signals received at the analog interface 814 are sensed and encoded by sense/encoding circuitry 816. As previously noted the encoding circuitry may assign different digital values to a given analog signal, depending upon whether the memory from which the signal is obtained is a binary or "other-ary" memory.

In an illustrative embodiment, encoded digital information from the sensing/encoding circuit 816 is transferred to a read buffer 818 which provides temporary storage for data read from a memory. The control logic 808 operates the read 818 and write 810 buffers to execute transfers of data between the system and memory sides of the controller 800. Such transfers may include direct memory access or double data rate transfers, for example. Control logic 808 exercises control over address 820 and timing and control circuitry 822 to implement such data transfers.

In an illustrative embodiment the memory address interface 820 operates by providing addresses to standalone unipolar MOS programmable resistance memories in accordance with the principles of the present invention by multiplexing addresses (that is, by sequentially presenting "row" and "column" addresses). Such address multiplexing is known in the art and permits a reduction in the number of physical connections, referred to as "pinout," required for the address interface 820 and each of the stand along memory chips.

The memory timing and control circuit 822 produces signals, Row Address Strobe (RAS) and Column Address Strobe (CAS) that operate to latch the row and column components of addresses into memories being accessed. Additionally, the memory timing and control circuit 822 provides READ and WRITE signals to the memories being controlled by the memory controller 800, which the memories employ, as previously described, to develop the appropriate signal (READ, WRITE1, or WRITE0 current pulse, for example) for a memory cell being accessed. In an illustrative embodiment, the memory timing and control circuit 822 generates one or more chip select signals, CHIP SELECT, which may be employed by the controller 800 in the addressing/memory-mapping scheme.

One or more clock signals, CLOCK, may be distributed to the standalone memories under control of the controller 800. Such clock signals may be used by the standalone memories to develop multiphase clocks for the execution of internal logic or may be used to synchronize the memories with a system clock in order to permit rapid transfers of data between the system and memory, for example.

Test signals, labeled TEST, generated by the memory timing and control circuit 822 are employed by standalone memories to perform self tests. As described in the discussion related to FIG. 6 each standalone memory may include self-test circuitry. In an illustrative embodiment, a memory controller in accordance with the principles of the present invention 800 may provide support for such self tests through use of the TEST signal (s). The memory timing and control circuit 822 may include circuits for memory sequencing, sensing circuits, I/O signal amplification, redundancy control circuits, delay elements, test mode control circuits, reliability stress algorithms, address transition detection circuits (from the system address bus), user selectable operating mode detection circuits (from the system), voltage and/or current reference generators, or voltage generator modules. The memory timing and control circuit 822 may also include circuitry configured to operate with control logic 808 and the system bus interface (802, 804, 806) to provide a high speed data interface, for example.

In an illustrative embodiment, the memory controller 800 may be configured to provide refresh control for standalone unipolar MOS programmable resistance memories in accordance with the principles of the present invention. That is, a standalone unipolar MOS programmable resistance memory in accordance with the principles of the present invention may exhibit a wide range of data retention characteristics, varying from microseconds to decades and for those memories that exhibit relatively short retention periods, a memory controller in accordance with the principles of the present invention includes refresh circuitry that ensures that the memory retains data for a period of time appropriate to a given application. For example, the memory timing and control circuit 822 may operate the various memory interfaces (including the memory, data, and analog interfaces, for example) to perform a periodic read/rewrite cycle on each memory location in the bank of standalone memories under control of the memory controller 800.

The memory controller 800 may also include circuitry configured for identifying and correcting "weak bits" within a standalone memory array in accordance with the principles of the present invention. The term "weak bits" refers to memory cells or elements that, although they have not failed, hold values that fall outside a preferred range of values and provide less than a desirable margin for read. To that end, in an illustrative embodiment the controller 800 may include circuitry configured to sense the value of a memory cell (which value may take the form of a resistance value) and compare that value to a preferred range of values. If the value stored within a memory falls outside the preferred range, but is, nevertheless determined to be valid (indicating that the cell has not failed), the controller rewrites the cell to a value within the preferred range.

Figure 9:
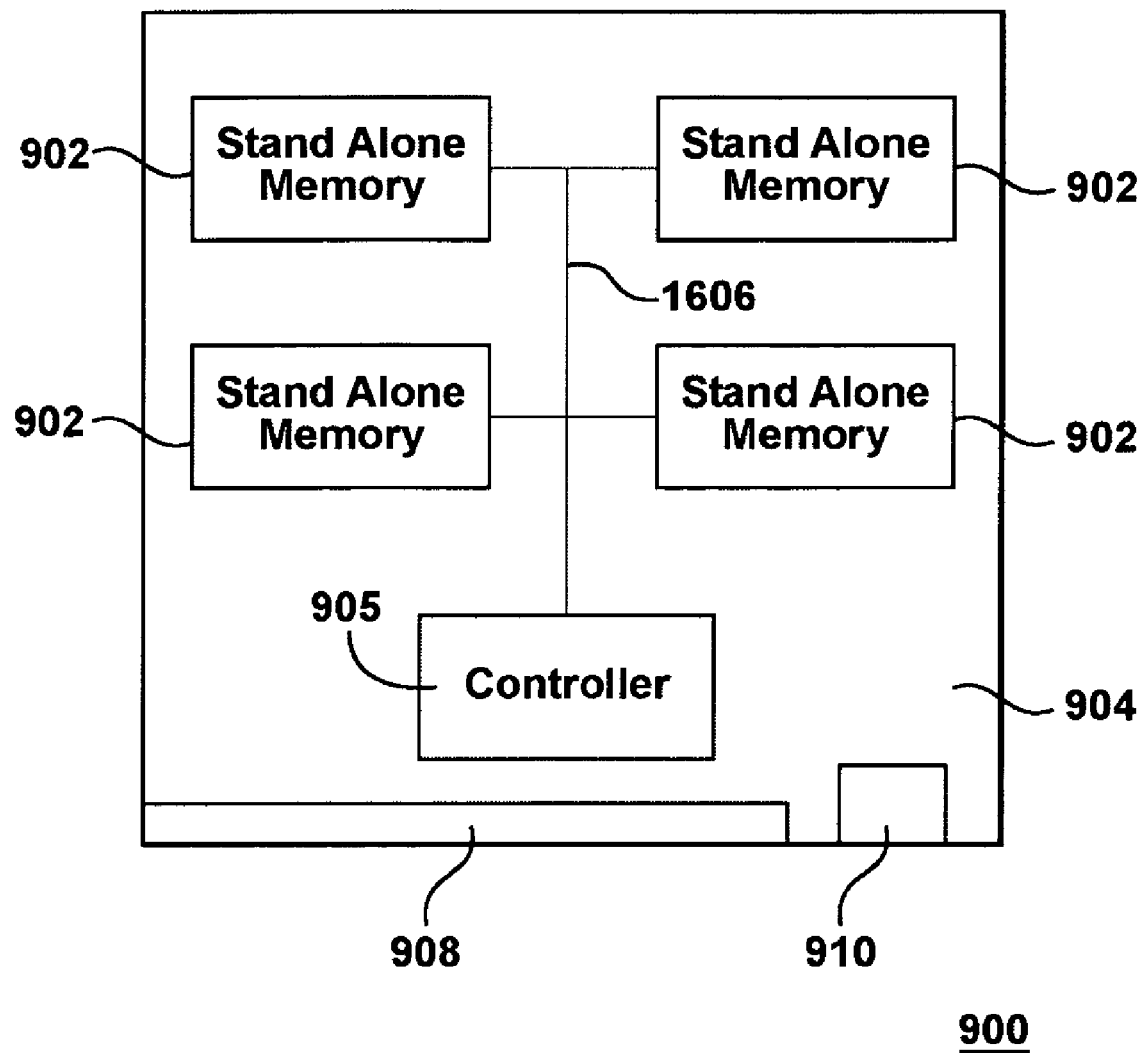
FIG. 9 is a block diagram of a memory system employing unipolar MOS programmable resistance memories in accordance with the principles of the present invention.

In the illustrative embodiment of FIG. 9 a memory system 900 in accordance with the principles of the present invention includes one or more standalone unipolar MOS programmable resistance memories 902 operating under the control of a controller 905. A plurality of standalone memory devices 902 in accordance with the principles of the present invention may be joined via interconnecting conductive lines 906 patterned on a substrate, such as a printed circuit board, for example. Conductive interconnecting lines may be patterned in a multilayer substrate, in order to connect components through conductive lines situated on different layers of the substrate, for example.

A memory controller 905 may be connected to the same substrate 904 using surface mount or through-hole technology, for example, and configured to operate the standalone memories 902 in a manner previously described. The memory controller 905 may itself be a unipolar MOS component. Alternatively, the memory controller may be formed in separate processes, such as a conventional CMOS process, then connected to the standalone memories mounted on the substrate through processes such as those employed in hybrid circuit or printed circuit board manufacture, for example. The memory system 900 may communicate with other components using conventional interconnection components, such as edge connector 908 or other self-contained connector 910 which may be a high speed optical or coaxial connector, for example.

The electronic device(s) described in the discussion related to the previous figures may be employed to particular advantage in a wide variety of systems. The schematic diagram of FIG. 10 will be discussed to illustrate the devices' use in a few such systems. The schematic diagram of FIG. 10 includes many components and devices, some of which may be used for specific embodiments of a system in accordance with the principles of the present invention and others not used. In other embodiments, other similar systems, components and devices may be employed. In general, the system includes logic circuitry configured to operate along with standalone memory which may include unipolar MOS programmable resistance memory in accordance with the principles of the present invention. The logic circuitry may be discrete, programmable, application-specific, or in the form of a microprocessor, microcontroller, or digital signal processor, for example. The embodiments herein may be employed on integrated chips or connected to such circuitry. The exemplary system of FIG. 10 is for descriptive purposes only. Although the description may refer to terms commonly used in describing particular computer, communications, tracking, and entertainment systems; the description and concepts equally apply to other systems, including systems having architectures dissimilar to that illustrated in FIG. 10. The electronic system 1000, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 10 may employ a standalone unipolar MOS programmable resistance memory, for example.

In an illustrative embodiment, the system 1000 may include a central processing unit (CPU) 1005, which may be implemented with some or all of a microprocessor, a random access memory (RAM) 1010 for temporary storage of information, and a read only memory (ROM) 1015 for permanent storage of information. A memory controller 1020 is provided for controlling RAM 1010. In accordance with the principles of the present invention, all of, or any portion of, any of the memory elements (e.g. RAM or ROM) may be implemented as a standalone memory which may include unipolar MOS programmable resistance memory.

An electronic system 1000 in accordance with the principles of the present invention may be a microprocessor that operates as a CPU 1005, in combination with embedded unipolar MOS programmable resistance memory that operates as RAM 1010 and/or ROM 1015, or as a portion thereof. In this illustrative example, the microprocessor/unipolar MOS programmable resistance memory combination may be standalone, or may operate with other components, such as those of FIG. 10 yet-to-be described.

In implementations within the scope of the invention, a bus 1030 interconnects the components of the system 1000. A bus controller 1025 is provided for controlling bus 1030. An interrupt controller 1035 may or may not be used for receiving and processing various interrupt signals from the system components. Such components as the bus 1030, bus controller 1025, and interrupt controller 1035 may be employed in a large-scale implementation of a system in accordance with the principles of the present invention, such as that of a standalone computer, a router, a portable computer, or a data storage system, for example.

Mass storage may be provided by diskette 1042, CD ROM 1047, or hard drive 1052. Data and software may be exchanged with the system 1000 via removable media such as diskette 1042 and CD ROM 1047. Diskette 1042 is insertable into diskette drive 1041 which is, in turn, connected to bus 1030 by a controller 1040. Similarly, CD ROM 1047 is insertable into CD ROM drive 1046 which is, in turn, connected to bus 1030 by controller 1045. Hard disc 1052 is part of a fixed disc drive 1051 which is connected to bus 1030 by controller 1050. Although conventional terms for storage devices (e.g., diskette) are being employed in this description of a system in accordance with the principles of the present invention, any or all of the storage devices may be implemented using standalone unipolar MOS programmable resistance in accordance with the principles of the present invention. Removable storage may be provided by a nonvolatile storage component, such as a thumb drive, that employs a unipolar MOS programmable resistance memory in accordance with the principles of the present invention as the storage medium. Storage systems that employ unipolar MOS programmable resistance memory as "plug and play" substitutes for conventional removable memory, such as disks or CD ROMs or thumb drives, for example, may emulate existing controllers to provide a transparent interface for controllers such as controllers 1040, 1045, and 1050, for example.

User input to the system 1000 may be provided by any of a number of devices. For example, a keyboard 1056 and mouse 1057 are connected to bus 1030 by controller 1055. An audio transducer 1096, which may act as both a microphone and/or a speaker, is connected to bus 1030 by audio controller 1097, as illustrated. Other input devices, such as a pen and/or tabloid may be connected to bus 1030 and an appropriate controller and software, as required, for use as input devices. DMA controller 1060 is provided for performing direct memory access to RAM 1010, which, as previously described, may be implemented in whole or part using unipolar MOS programmable resistance memory devices in accordance with the principles of the present invention. A visual display is generated by video controller 1065 which controls display 1070. The display 1070 may be of any size or technology appropriate for a given application.

In a cellular telephone or portable entertainment system embodiment, for example, the display 1070 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 1000 may also include a communications adaptor 1090 which allows the system to be interconnected to a local area network (LAN) or a wide area network (WAN), schematically illustrated by bus 1091 and network 1095. An input interface 1099 (not shown) operates in conjunction with an input device 1093 (not shown) to permit a user to send information, whether command and control, data, or other types of information, to the system 1000. The input device and interface may be any of a number of common interface devices, such as a joystick, a touch-pad, a touch-screen, a speech-recognition device, or other known input device. In some embodiments of a system in accordance with the principles of the present invention, the adapter 1090 may operate with transceiver 1073 and antenna 1075 to provide wireless communications, for example, in cellular telephone, RFID, and wifi computer implementations.

Operation of system 1000 is generally controlled and coordinated by operating system software. The operating system controls allocation of system resources and performs tasks such as processing scheduling, memory management, networking, and I/O services, among other things. In particular, an operating system resident in system memory and running on CPU 1005 coordinates the operation of the other elements of the system 1000.

In illustrative handheld electronic device embodiments of a system 1000 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 1055, keyboard 1056 and mouse 1057, for example. Embodiments with a transmitter, recording capability, etc., may also include a microphone input (not shown).

In an illustrative RFID transponder implementation of a system 1000 in accordance with the principles of the present invention, the antenna 1075 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 1073 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a unipolar MOS programmable resistance memory in accordance with the principles of the present invention. In this illustrative embodiment, data read out from the memory is transferred to the transceiver 1073 as an "answerback" signal on the antenna 1075 at a second carrier frequency $F_2$. In passive RFID systems, power is derived from the interrogating signal and memory such as provided by a unipolar MOS programmable resistance memory in accordance with the principles of the present invention is particularly well suited to such use.

I claim:

1. An electronic memory, comprising:
   an array of programmable resistance memory cells;
   an epitaxial diode configured to operate as an access device for a programmable resistance memory cell; and
   unipolar MOS peripheral circuitry configured to read and write to the memory cells.

2. The electronic memory of claim 1 wherein the unipolar MOS peripheral circuitry includes an address decoder.

3. The electronic memory of claim 1 wherein the unipolar MOS peripheral circuitry includes row drivers.

4. The electronic memory of claim 1 wherein the unipolar MOS peripheral circuitry includes column drivers.

5. The electronic memory of claim 1 wherein the unipolar MOS peripheral circuitry includes WRITE source circuitry.

6. The electronic memory of claim 1 wherein the unipolar MOS peripheral circuitry includes READ sense circuitry.

7. The electronic memory of claim 1 wherein each memory cell includes a phase change memory element.

8. The electronic memory of claim 7 wherein the phase change memory element is a confined memory element.

9. The electronic memory of claim 8 wherein the phase change memory element includes a chalcogenide material coupled to two electrodes.

10. The electronic memory of claim 9 wherein the memory array and unipolar MOS peripheral circuitry are interconnected by one or more copper or aluminum interconnect lines.

11. The electronic memory of claim 10 wherein an N+ rowline is formed within a substrate and a copper or aluminum interconnect line mirrors the output.

12. The electronic memory of claim 11 wherein the N+ rowline has cathodes of epitaxial diode access devices along the rowline of a memory array connected to it.

13. The electronic memory of claim 11 wherein periodic taps are made to the N+ rowline strapping a parallel copper interconnect rowline.

* * * * *